(12) United States Patent
Mentchoukov et al.

(10) Patent No.: US 9,575,934 B2
(45) Date of Patent: *Feb. 21, 2017

(54) SYSTEMS AND METHODS FOR ADAPTIVE CONTENT DISTRIBUTION

(71) Applicant: LEFTSNRIGHTS, INC., Salt Lake City, UT (US)

(72) Inventors: Nikolai Mentchoukov, Henderson, NV (US); James Warren Rowan, Scottsdale, AZ (US)

(73) Assignee: LEFTSNRIGHTS, INC., Salt Lake City, UT (US)

( * ) Notice: Subject to any disclaimer, the term of this patent is extended or adjusted under 35 U.S.C. 154(b) by 94 days.

This patent is subject to a terminal disclaimer.

(21) Appl. No.: 14/521,252

(22) Filed: Oct. 22, 2014

(65) Prior Publication Data

US 2015/0143231 A1 May 21, 2015

Related U.S. Application Data

(63) Continuation of application No. 13/851,831, filed on Mar. 27, 2013, now Pat. No. 8,881,033, which is a (Continued)

(51) Int. Cl.
| | |
|---|---|
| *G06F 17/21* | (2006.01) |
| *G06F 17/30* | (2006.01) |
| *H04L 12/24* | (2006.01) |
| *H01L 41/22* | (2013.01) |
| *G06F 3/0484* | (2013.01) |
| *G06F 3/0485* | (2013.01) |

(52) U.S. Cl.
CPC .......... *G06F 17/212* (2013.01); *G06F 3/0485* (2013.01); *G06F 3/04847* (2013.01); *G06F 17/3089* (2013.01); *H01L 41/22* (2013.01); *H04L 41/22* (2013.01)

(58) Field of Classification Search
None
See application file for complete search history.

(56) References Cited

U.S. PATENT DOCUMENTS

| | | | |
|---|---|---|---|
| 6,934,743 B2 | 8/2005 | Huat | |
| 6,983,331 B1 * | 1/2006 | Mitchell | ........... G06F 17/30905 707/E17.121 |

(Continued)

OTHER PUBLICATIONS

Office Action mailed Jul. 31, 2013 for U.S. Appl. No. 13/135,089, filed Jun. 24, 2011.

(Continued)

*Primary Examiner* — Mahelet Shiberou
(74) *Attorney, Agent, or Firm* — Stoel Rives LLP

(57) ABSTRACT

An application displaying primary content, such as a webpage, may include unused space. The unused space may exist within the application displaying the primary content (e.g., within the browser window) or on other portions of the display (e.g., outside of the browser window). The unused space is identified and leveraged to display secondary content on the client display along with the primary content. The secondary content may be adaptable to conform to different sizes and/or configurations of the unused space. The secondary content may be updated as the user interacts with elements on the client display.

20 Claims, 21 Drawing Sheets

Related U.S. Application Data continuation of application No. 13/135,089, filed on Jun. 24, 2011, now Pat. No. 8,832,559.

(60) Provisional application No. 61/358,790, filed on Jun. 25, 2010, provisional application No. 61/435,740, filed on Jan. 24, 2011.

(56) References Cited

U.S. PATENT DOCUMENTS

| | | |
|---|---|---|
| 7,379,976 B2 | 5/2008 | Huat |
| 7,502,867 B2 | 3/2009 | Mitchell et al. |
| 8,086,491 B1 | 12/2011 | Matz et al. |
| 8,396,745 B2 | 3/2013 | Pen |
| 8,832,559 B2 | 9/2014 | Mentchoukov et al. |
| 8,881,033 B2 | 11/2014 | Mentchoukov et al. |
| 2002/0015042 A1 | 2/2002 | Robotham et al. |
| 2005/0138019 A1 | 6/2005 | Betts et al. |
| 2006/0190401 A1 | 8/2006 | Akadiri |
| 2008/0059571 A1 | 3/2008 | Khoo |
| 2008/0098296 A1 | 4/2008 | Brichford et al. |
| 2009/0091578 A1 | 4/2009 | Carnahan et al. |
| 2009/0248524 A1 | 10/2009 | Defoy et al. |
| 2009/0281889 A1 | 11/2009 | Derosa-Grund |
| 2010/0153836 A1 | 6/2010 | Krassner et al. |
| 2011/0145730 A1* | 6/2011 | Zhou ................. G06F 17/30902 715/760 |
| 2011/0320529 A1 | 12/2011 | Mentchoukov et al. |
| 2012/0254721 A1 | 10/2012 | Jain et al. |

OTHER PUBLICATIONS

Office Action mailed Jan. 17, 2014 for U.S. Appl. No. 13/135,089, filed Jun. 24, 2011.

Notice of Allowance mailed Jul. 24, 2014 for U.S. Appl. No. 13/135,089, filed Jun. 24, 2011.

Office Action mailed Jul. 30, 2013 for U.S. Appl. No. 13/851,831, filed Mar. 27, 2013.

Office Action mailed Jan. 22, 2014 for U.S. Appl. No. 13/851,831, filed Mar. 27, 2013.

Notice of Allowance mailed Aug. 13, 2014 for U.S. Appl. No. 13/851,831, filed Mar. 27, 2013.

International Search Report mailed Feb. 17, 2012 for application PCT/US2011/041957, filed Jun. 27, 2011.

* cited by examiner

500 →
501   502
503
| Tags | Broadcast | Reports |

Get Tag | Add Website/Section | Websites/Section List

505 — Website/Section URL: [                    ]

Demographics 510
Gender:   Male: [50%]  Female: [50%]
Age:      From: [10]  To: [71]
Race:     White:☐ Black:☐ Hispanic:☐ Asian:☐
Marital Status: Single: [50%]  Married: [50%]
Household Income: [Any ▽]

Content Rendering 520
Page Width:   ⦿ Center  ○ Left  ○ Right
Page Align:        [980] px
Minimum Sq. pixels: [65,520]
Minimum Height:    [400] px
Minimum Width:     [250] px Number of ads on the left side of the screen if the
page is aligned Center or Right: [1]
Number of ads on the right side of the screen if the
page is aligned Center or Left: [2]

Virtual Board Margins (px):
Left  Top  Right  Bottom  Between two vertical ads
[1]  [1]  [1]    [1]     [1]

Tags | Broadcast | Reports

Upload Content | My Content | New Campaign | My Campaign | Create Placement — 803

802

805

Content #1

Target Demographics 810

Channel: N/A ▽

Gender: Male: 50% Female: 50%
Age: From: 10 To: 71
Race: White: ☐ Black: ☐ Hispanic: ☐ Asian: ☐
Marital Status: Single: 50% Married: 50%
Household Income: Any ▽
Location: Any ▽

Timeframe 820

Start: ☐ Time: ☐
End: ☐ Time: ☐

Rendering Conditions 830

Minimum Square ☐
Minimum Width ☐ px
Minimum Height ☐ px

Reach 1,000,000
Frequency 3

Target URLs 840

| Website/Section/Page | Date Created | Page Width | Page Align | Assign |
|---|---|---|---|---|
| http://www.mydomain.com | 12/12/2020 | 970px | Center | ☐ |
| http://www.mydomain2.com | 12/12/2020 | 940px | Left | ✓ |
| http://www.mydomain.com/sec_1 | 12/12/2020 | 970px | Center | ☐ |
| ... | | | | |

Figure 8

SYSTEMS AND METHODS FOR ADAPTIVE CONTENT DISTRIBUTION

CROSS-REFERENCE TO RELATED APPLICATIONS

This application is a continuation of, and claims priority to, U.S. patent application Ser. No. 13/135,089, entitled, "Content Distributed System and Method," filed Jun. 24, 2011 for Nikolai Mentchoukov et al., and which claims priority to U.S. Provisional Patent Application No. 61/358,790, entitled "Content Distribution System and Method," filed Jun. 25, 2010, and to U.S. Provisional Patent Application No. 61/435,740, entitled "Content Distribution System and Method," filed on Jan. 24, 2011, each of which is hereby incorporated by reference in its entirety.

COPYRIGHT NOTICE

© 2010 Leftsnrights, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever per 37 CFR §1.71 (d).

BRIEF DESCRIPTION OF THE DRAWINGS

FIG. 5 depicts an exemplary interface for managing a tag record;

FIG. 8 depicts an exemplary interface for managing a placement record;

DETAILED DESCRIPTION

Network accessible services, such as web servers, provide content to client devices over a network (e.g., the Internet). The client devices render the content on a display using a client-side application, such as a web browser (e.g., Microsoft Internet Explorer®, Mozilla Firefox®, Google Chrome, or the like). The content is typically capable of being rendered on a wide variety of different client devices, having different display and rending capabilities. Moreover, the display area in which the content is rendered may be dynamically sized. For example, a user may change the position, size, and/or orientation of a browser window on a client display. Accordingly, when "primary" content is rendered in a client display, the display area may include "unused space." As used herein, unused space refers to a portion of a display that is not being used to display rendered "primary" content. As used herein, "content" refers to any form of renderable, content including, but not limited to, Hyper Text Markup Language (HTML) content, eXtensible Markup Language (XML) content, Virtual Reality Markup Language (VRML) content, Flash® content, graphical content (e.g., images), video content, text content, or the like.

In some embodiments, the systems and methods disclosed herein leverage unused space on a client display to present secondary content. The secondary content may be displayed along with the primary content on the client display. As used herein, secondary content refers to any content that can be presented on a client display including, but not limited to, text, images, video, audio, markup (e.g., HTML), interactive content (e.g., Flash®, ActionScript®, Java® Applet, etc.), or the like. Secondary content may be rendered on a client display before, after, and/or concurrently with rendering the primary content. In some embodiments, secondary content may be displayed in the absence of primary content (e.g., as shown in FIGS. 1F, 1G, and 1H described below). Secondary content may be unrelated to the primary content. Accordingly, secondary content may be published and/or accessed from an entity other than the provider of the primary content (e.g., from another network-accessible service, web server, or the like).

Figure 1A:
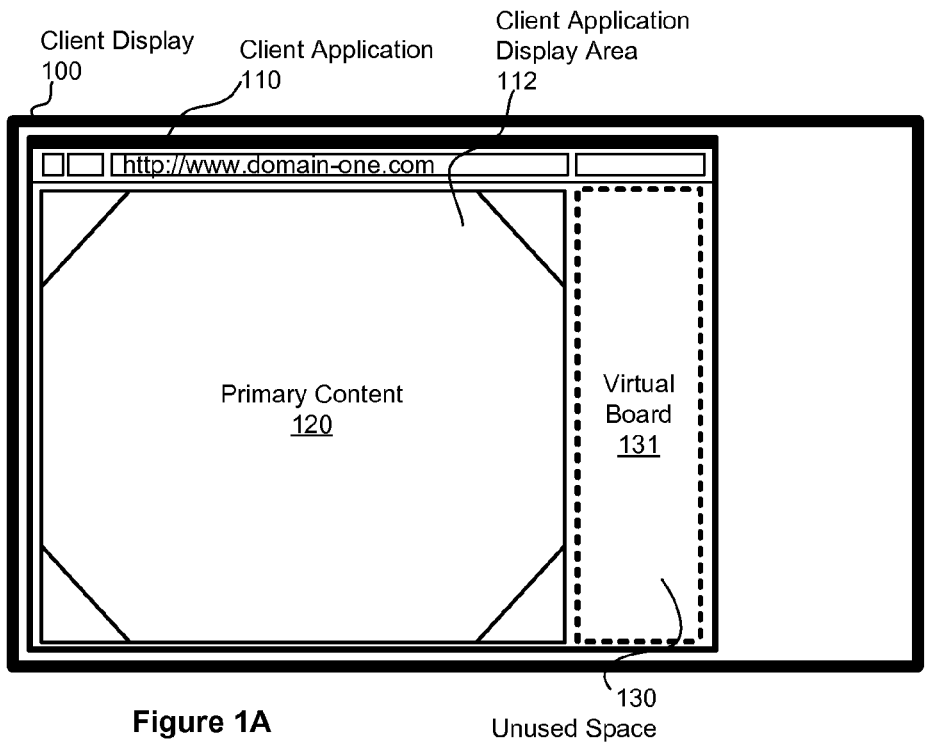
FIGS. 1A-O depict exemplary client displays comprising identified, unused space.

FIG. 1A depicts an exemplary client display 100 displaying primary content 120 on a client device. As used herein, a client device may include, but is not limited to, a personal computer, a portable computer, a laptop, a netbook, a tablet, a smart phone, a personal digital assistant, or the like. Accordingly, the client display 100 may correspond to a monitor of a personal computer; the screen of a laptop, phone, or tablet; or the like.

In some embodiments, the client display 100 operates in a windowed environment, and the primary content 120 is displayed within a windowed client application 110 (e.g., web browser application). Alternatively, the client application 110 and the client display 100 may be co-extensive. For example, the client application 110 may operate in a "full screen" mode in which the client application display area 112 covers the entire client display 100, or the client display 100 may be configured to display a single application at a time as is typical with smaller form-factor devices, such as smart phones, tablets, and the like.

The client application 110 renders the primary content 120 in the client application display area 112. The rendered primary content 120 may not utilize the full client application display area 112, leaving unused space 130 in the client application display area 112. In some embodiments, the unused space 130 is identified and/or represented by a virtual board 131 (placeholder). As used herein, a virtual board refers to a placeholder that represents identified unused space within the client display 100, such as the unused space 130. The virtual board 131 may indicate the position, size, proportions, and/or orientation of the unused space 130 within the client display 100.

Figure 1B:
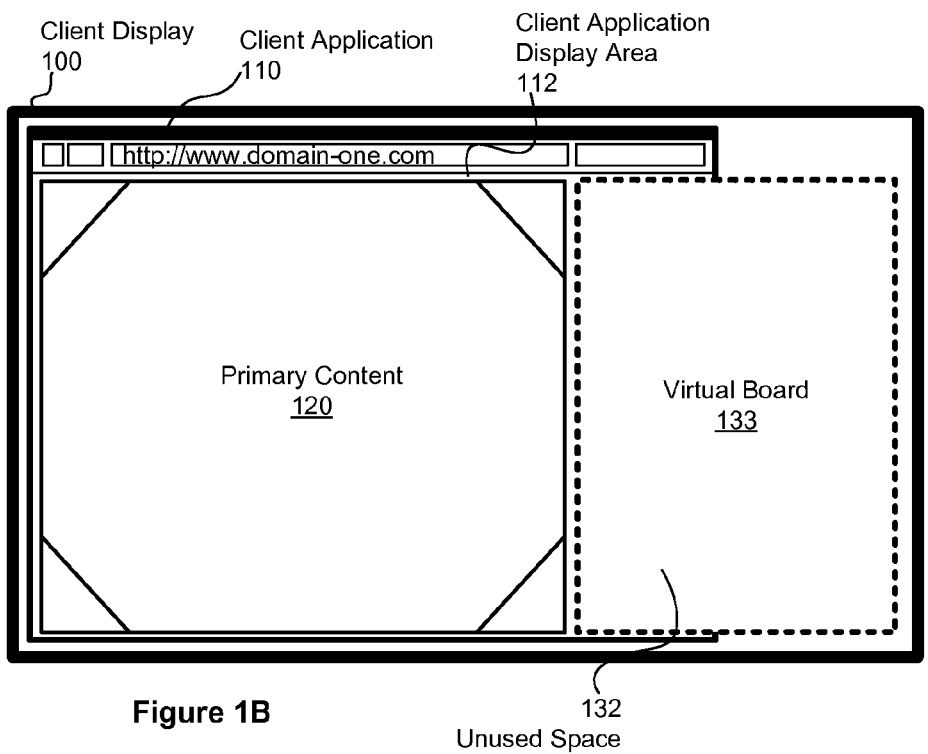
Figure 1C:
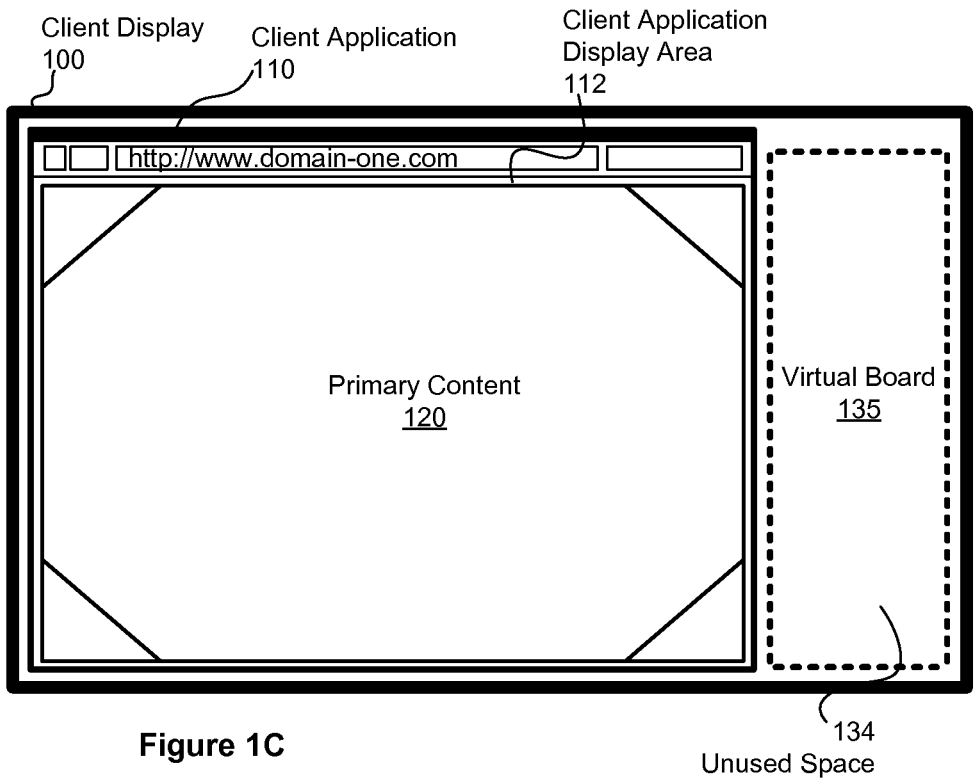
Figure 1D:
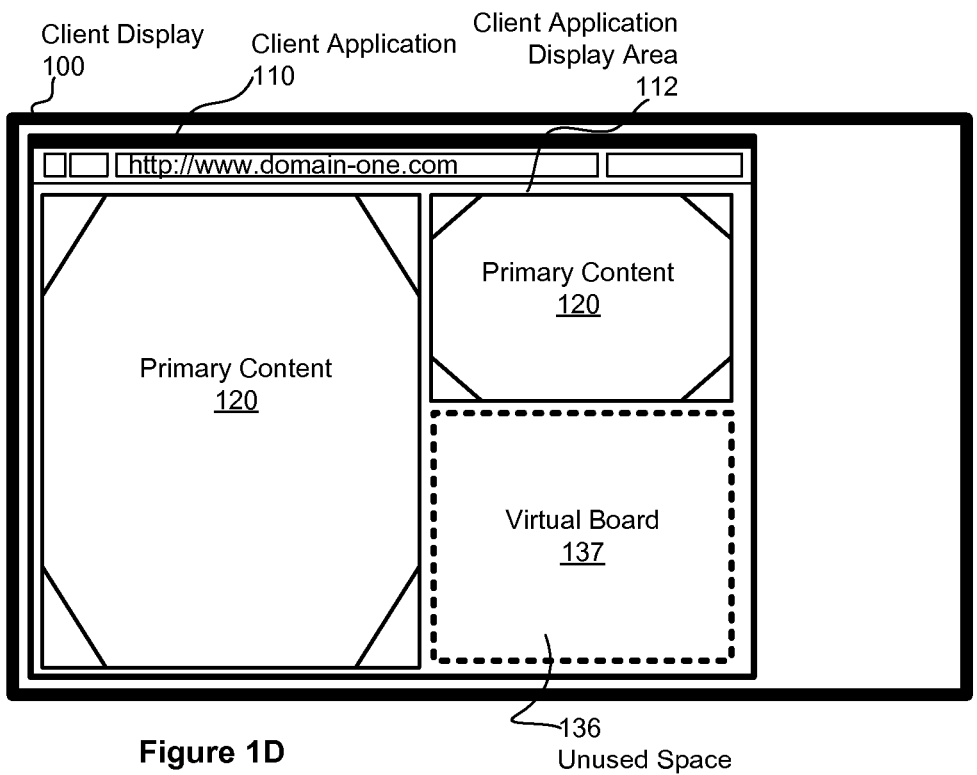

In some embodiments, unused space may be identified outside of the client application 110 or anywhere within the client display 100 (or in an external display). In FIG. 1B, the unused space 132 and corresponding virtual board 133 extend beyond the client application display area 112 into an unused portion of the client display 100. In the FIG. 1C example, the unused space 134 and corresponding virtual board 135 are entirely outside of the client application display area 112. Unused space may be identified "in-line" with primary content. The in-line unused space may be identified when the primary content is rendered by the client application 110. The FIG. 1D example shows unused space 136 and a corresponding virtual board 137 in-line with primary content 120.

Figure 1E:
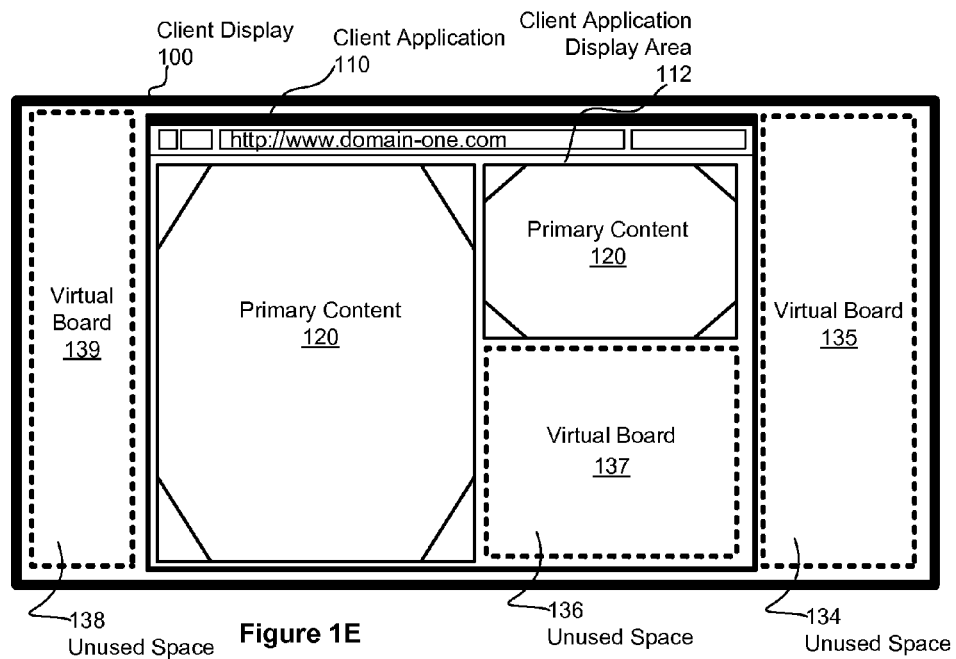
Figure 1F:
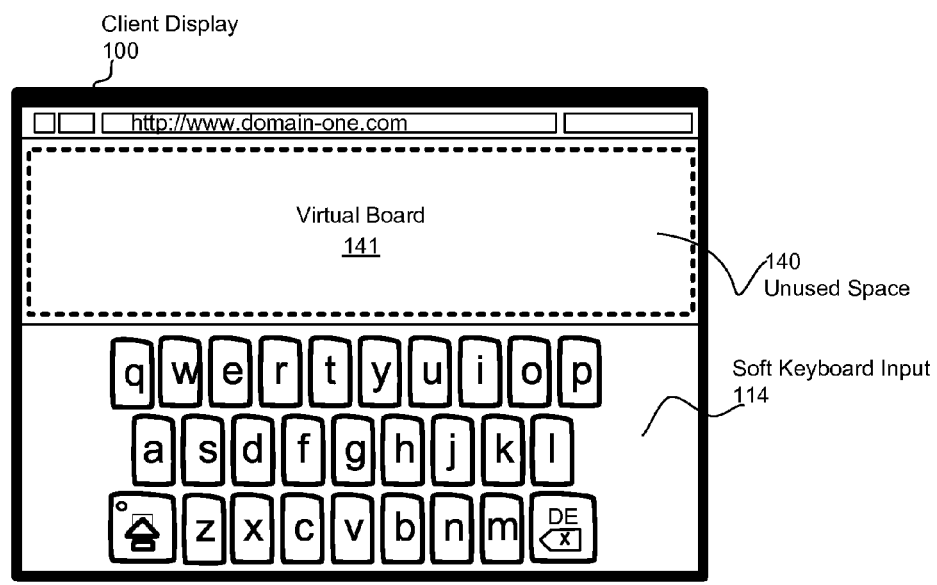
Figure 1G:
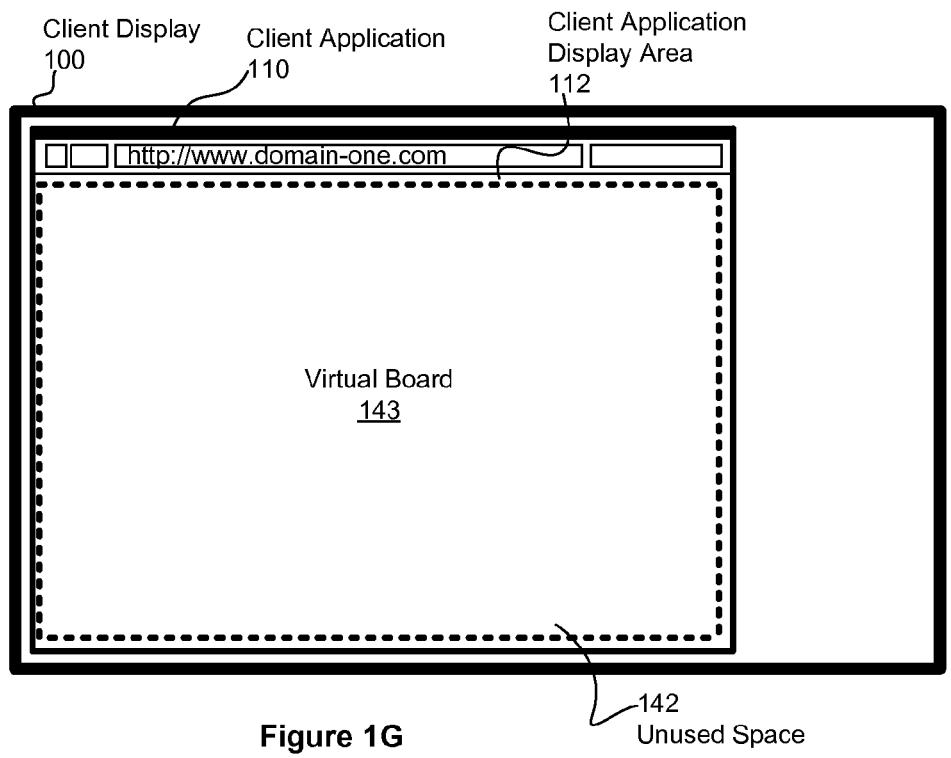
Figure 1H:
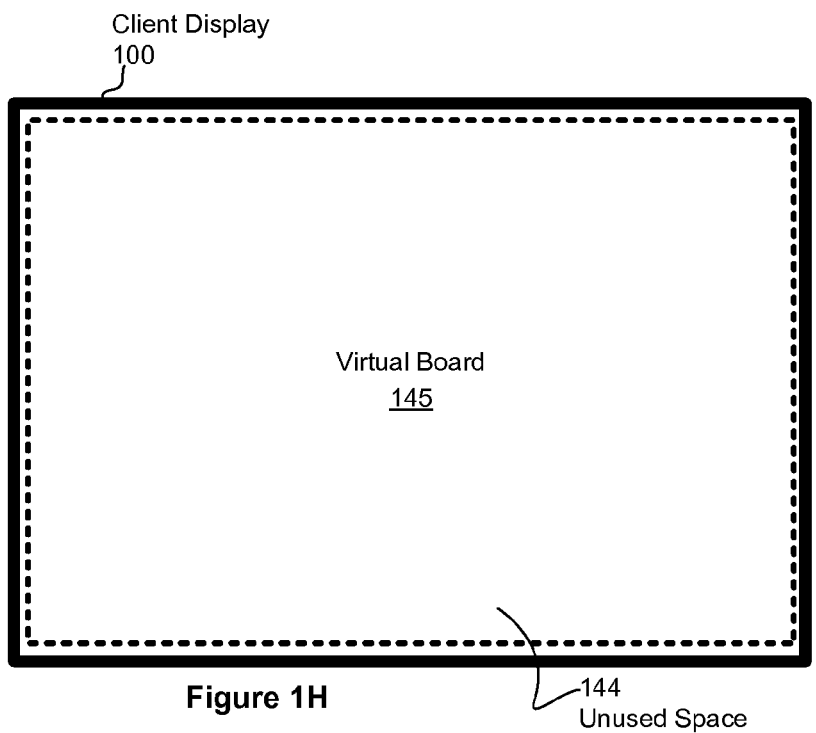

A client display may comprise any number of virtual boards, each representing a different identified portion of unused space. As shown in FIG. 1E, a client display 100 includes three unused spaces 134, 136, and 138, each of which is represented by respective virtual boards 135, 137, and 139.

The unused spaces in a client display may be adapted according to different client devices and/or display types. FIG. 1F shows an exemplary client display 100 comprising a soft keyboard input 114. When the input 114 is active, a portion 140 of the client display 100 is unused, which is represented by the virtual board 141.

Unused space may be identified when content is not rendered in the client display 100 (e.g., no primary content 120 has been requested primary content cannot be loaded or is invalid, etc.). As shown in FIG. 1G, the client application display area 112 may, therefore, be identified as unused space 142 and represented as a virtual board 143. Alternatively, or in addition, the client display area 100 may be identified as unused space 144 with a corresponding virtual board 145, as illustrated in FIG. 1H.

Figure 1I:
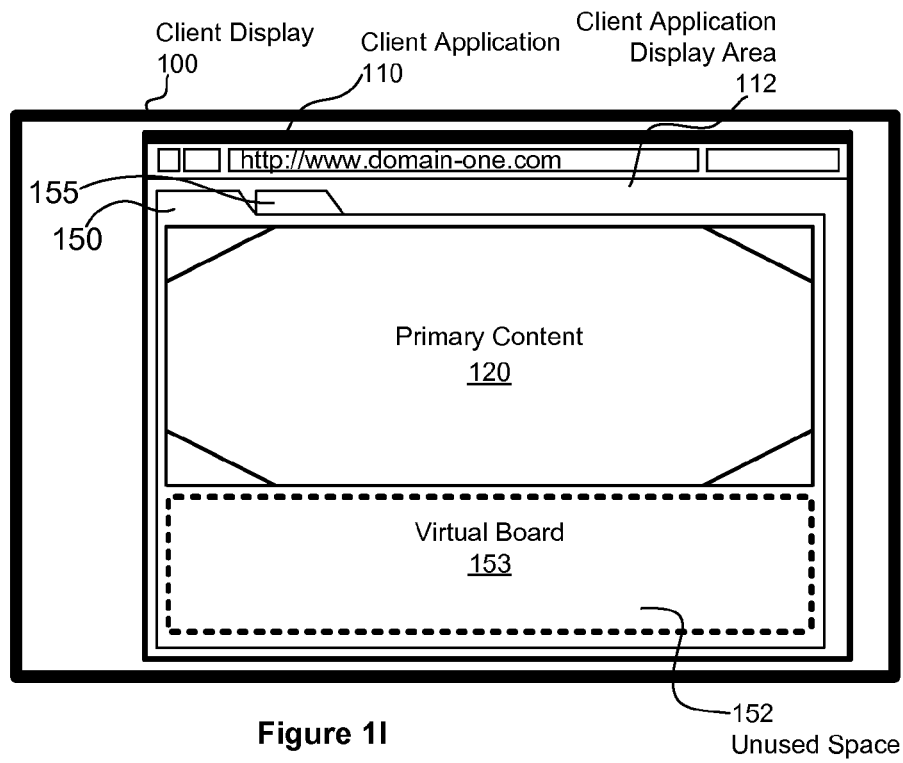
Figure 1J:
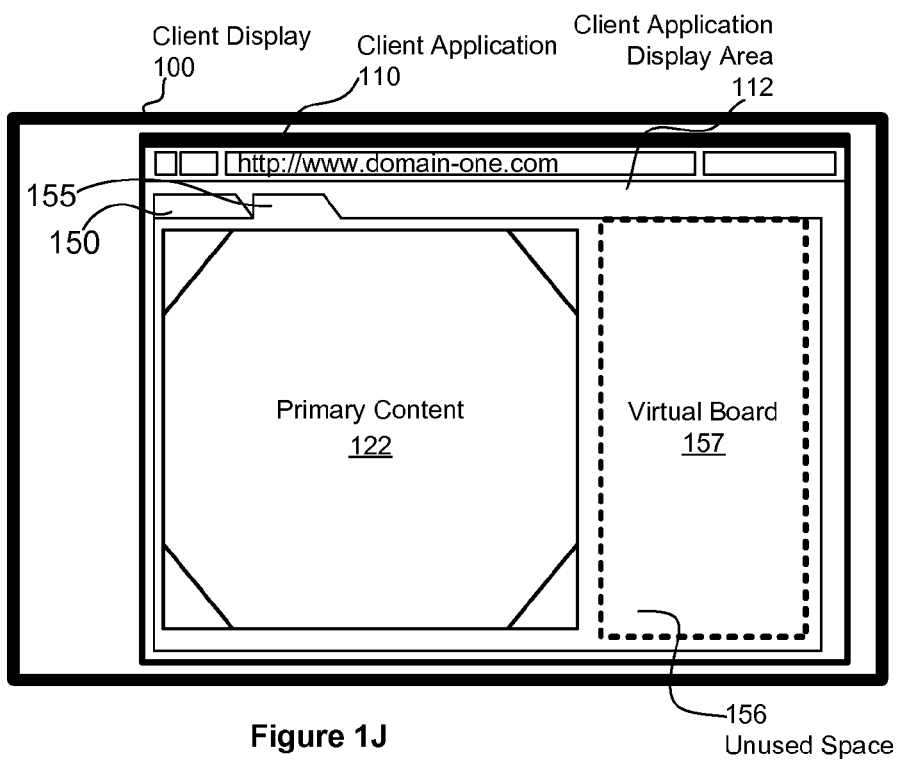

Referring to FIG. 1I, unused space may be identified in response to user interaction with interface elements on the client display 100. For example, the client application 110 may comprise a browser having multiple "tabs" 150 and 155. Each tab may display rendered content and/or may comprise respective unused space. When a first tab 150 is selected (e.g., in focus), the first tab displays primary content 120, having unused space 152. The identified unused space 152 is represented by the virtual board 153. When the second tab 155 is selected (in focus) as shown in FIG. 1J, different primary content 122 is presented in the client application 110. The second tab 155 includes a different portion of unused space 156, corresponding to a different virtual board 157.

Figure 1K:
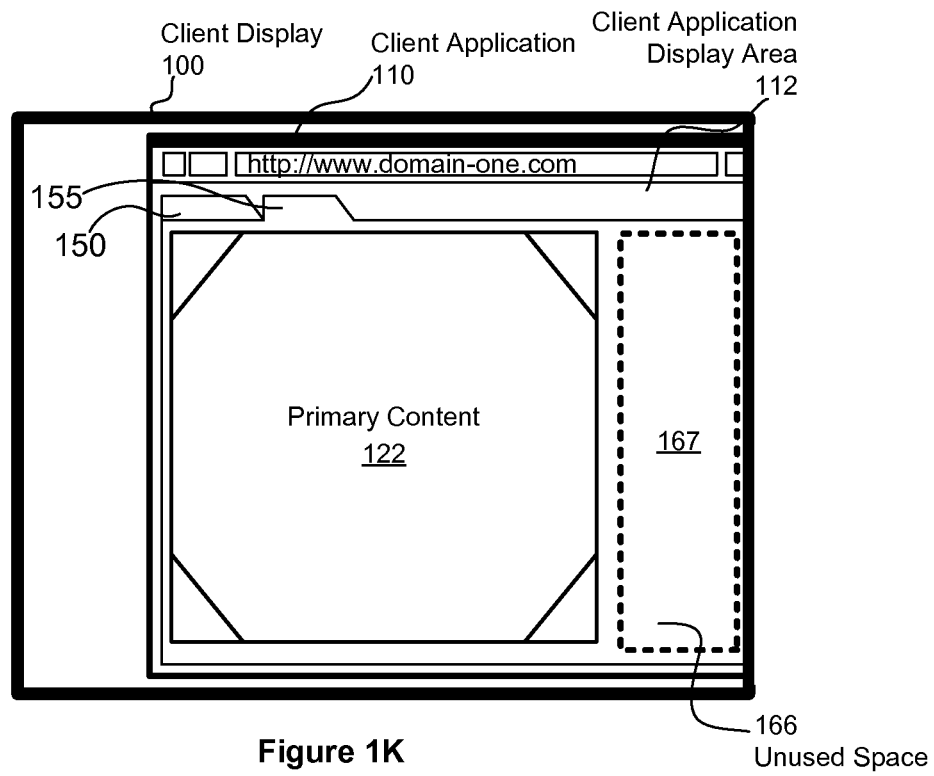
Figure 1L:
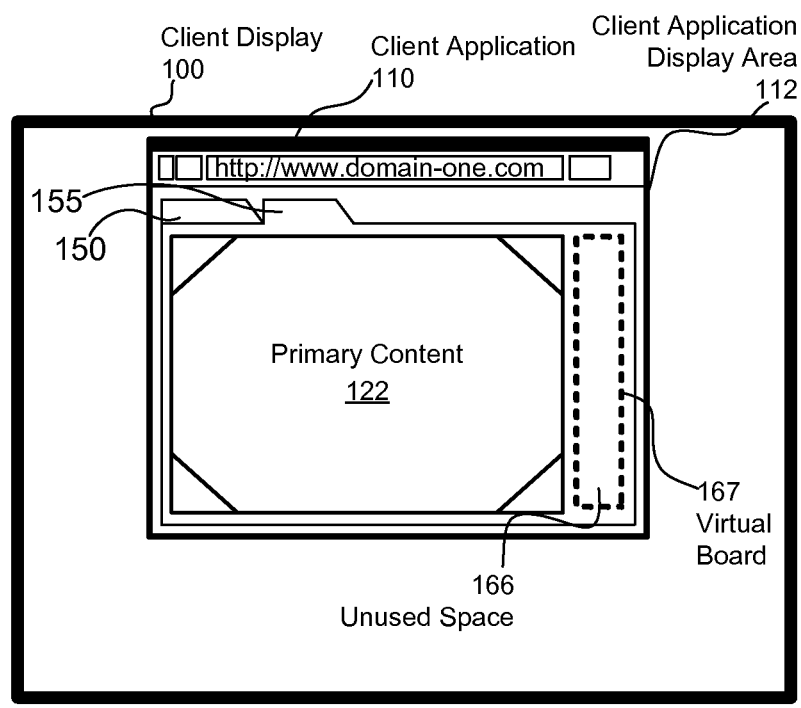

The unused space on the client display 100 may be identified (and corresponding virtual boards constructed) whenever the client display 100, client application 110, and/or primary content 120/122 are modified. As shown in FIG. 1K, a user may drag the client application 110 window toward an edge of the client display 100, such that a portion of the client application display area 112 is cut off. In response to this modification, the unused space 166 and corresponding virtual board 167 are updated (shifted and reduced in size). In the FIG. 1L example, a user resizes the client application display area 112, resulting in updates to the unused space 166 and corresponding virtual board 167. Similar updates may occur in response to dynamic changes in the primary content 120 and/or 122. For example, the primary content 120 and/or 122 may be dynamically updated (re-rendered), resulting in updates to the identified unused space and/or corresponding virtual boards.

Figure 1M:
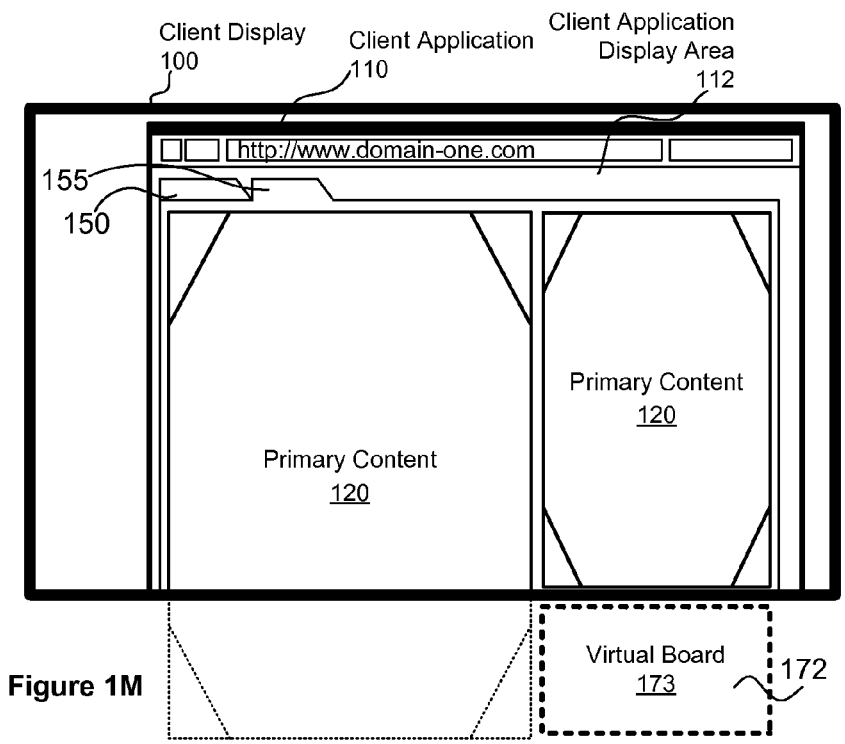

In some embodiments, a virtual board may be created to represent unused space that is not visible on the client display 100. As shown in FIG. 1M, unused space 172 is not visible until a user "scrolls" the page. As discussed below, however, the unused space may be identified by "pre-rendering" the primary content before it is rendered on the client display 100 (or creating a "virtual copy" of the primary content 120 in memory). The unused space 172 is identified in the virtual copy, and a corresponding virtual board 173 is created. When the virtual board 173 becomes visible (e.g., when the user scrolls the page), secondary content may be displayed thereon.

Figure 1N:
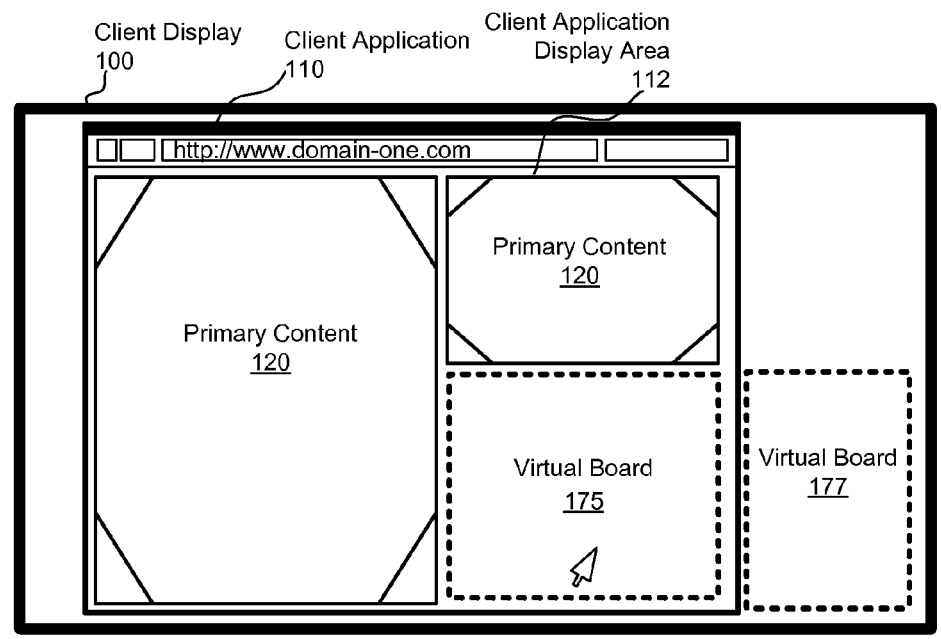

In some embodiments, unused space and/or corresponding virtual boards may be associated with one or more conditions. A virtual board may not be used to display secondary content until the one or more conditions are satisfied. Referring to FIG. 1N, a virtual board 175 may be used to display secondary content. Another virtual board 177 may not be used to display secondary content until a condition is met. The condition may require that a user interact with secondary content of the virtual board 175. When the condition is satisfied, the secondary content is rendered on the virtual board 177.

Figure 1O:
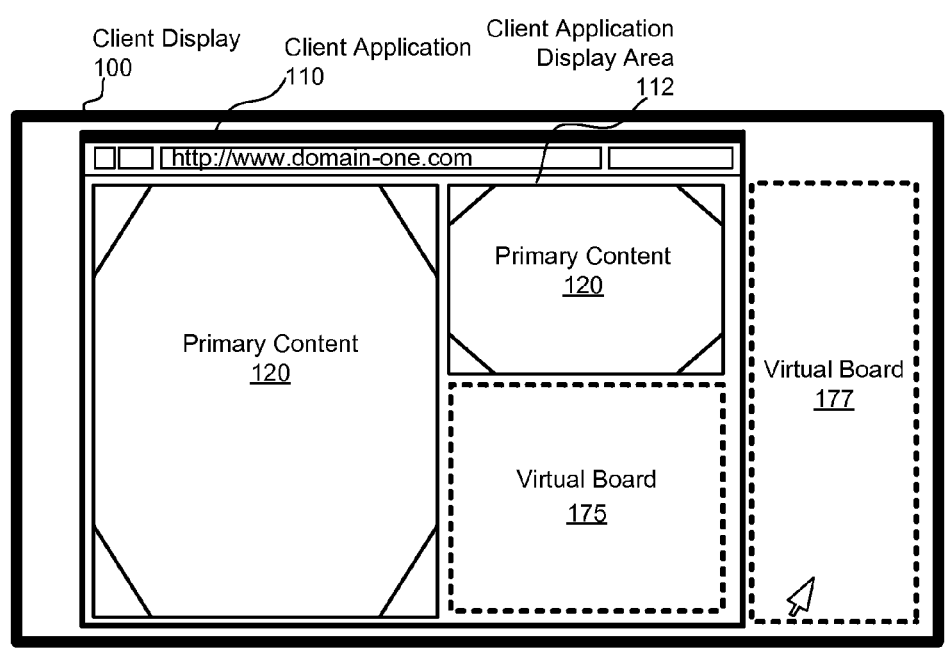

In another example, user interaction (or other conditions) may cause changes to a virtual board and/or the secondary content rendered thereon. For example, when a user interacts with secondary content rendered on the virtual board 177, the virtual board 177 may expand as depicted in FIG. 1O.

The virtual boards created in the unused space may be leveraged to include secondary content on the client display 100. The secondary content may include, but is not limited to, renderable content (e.g., HTML, XML, VRML, etc.), image assets, video, text, and the like.

In some embodiments, unused space is identified at the client device using executable code transmitted to the device by a network-accessible service (e.g., web server), such as a content distribution service (CDS). The unused space may be identified based upon various factors including, but not limited to, the resolution of the client display; display of other user interface elements; the focus of user interface elements on the client display (e.g., identifying foreground applications, selected tabs, etc.); the position, size, and/or orientation of the client application window; the configuration of the primary content (e.g., layout, orientation, alignment, etc.); rendering the primary content; pre-rendering of primary content; and so on. For example, unused space may be identified by creating a "virtual" copy of the primary content (e.g., by rendering the primary content on a "virtual page") and determining the coordinates of each formatting tag in the primary content to create a virtual layout of the primary content in memory without actually rendering the content on the client display 100. The coordinates and/or extent of unused space may be determined by analyzing the rendered virtual page.

In some embodiments, the primary content 120/122 includes a "tag" (or other identifier) that references code configured to identify unused space in the rendered primary content 120/122 and to create virtual boards representing the unused space. Secondary content may be displayed in the unused space. The secondary content may be selected and/or adapted according to the configuration of the virtual boards (e.g., the secondary content may be sized according to the available unused space as represented by the virtual boards).

Figure 2A:
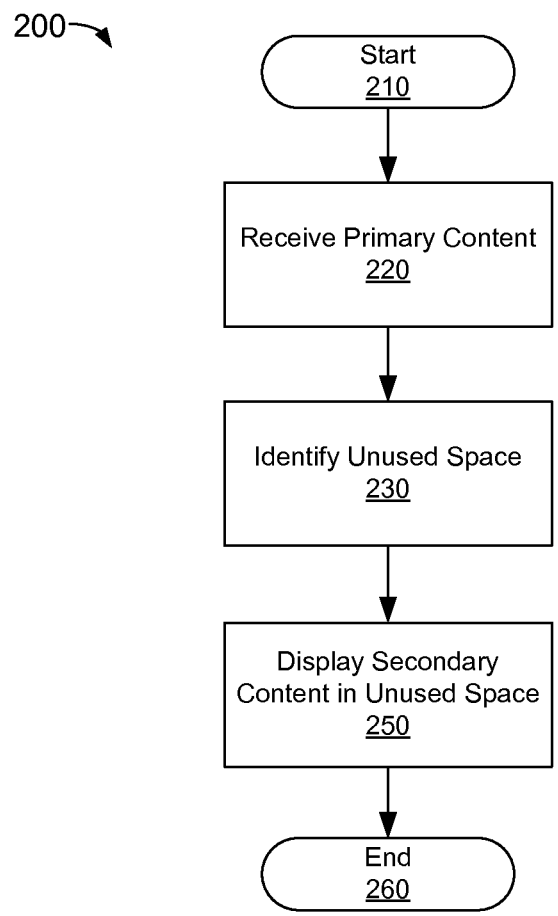
FIG. 2A is a flow diagram of one embodiment of a method for leveraging unused space on a client display.

FIG. 2A is a flow diagram of one embodiment of a method 200 for leveraging unused space. The method 200 starts and is initialized at step 210. The method 200 may operate on a client device having a display. As such, step 210 may comprise loading computer-readable instructions from a non-transitory storage medium and initializing hardware components of the client device, such as a display device, communication interfaces, and the like.

At step 220, the method 200 receives content to be rendered for display on the client device (e.g., primary content). The content may be received from a network-accessible service via a network communication interface (e.g., a web server).

Unused space is identified at step 230. The unused space may be identified in response to a tag or other identifier embedded within the content received at step 220. The tag may reference machine-executable code configured to cause the client device to identify unused space as described herein. Alternatively, or in addition, the client device and/or client application rendering the content may include machine-executable instructions for identifying unused space.

Identifying unused space at step 230 may include, but is not limited to, determining the resolution of the client display; determining the position, size, and/or orientation of other elements on the client display (e.g., other application windows); determining the focus of the user interface elements (e.g., identifying foreground applications, selected tabs, etc.); determining the position, size, and/or orientation of the client application window in which the primary content is to be displayed; determining the configuration of the primary content (e.g., layout, orientation, alignment, etc.); rendering the primary content; pre-rendering the primary content; and so on. In some embodiments, step 230 comprises rendering or pre-rendering the primary content to identify unused space. In some embodiments, the pre-rendering is implemented on a "virtual display" that represents the client application (e.g., a virtual HTML rendering engine). The primary content is rendered on the virtual display, which is then used to identify unused space thereon. In some embodiments, step 230 comprises determining the page width and/or alignment using, inter alia, JavaScript® or the like. Alternatively, or in addition, content width and/or alignment may be specified in a tag record and/or a registered content identifier (discussed below).

Step 230 may comprise filtering the identified unused spaces by one or more filtering criteria. The filtering criteria may include minimum size constraints to ignore unused spaces that fail to conform to height, width, and/or size requirements. The filtering criteria may further comprise determining whether the unused portion is visible (e.g., whether the unused portion falls outside of a viewable area of a display, is overlaid by another user interface element, is out of focus, etc.). The filtering criteria may specify a maximum threshold that limits the number of identified unused spaces. The maximum threshold may prevent the client display from becoming excessively cluttered with secondary content. When more than a maximum threshold of unused spaces is identified, the "best" spaces may be selected. The selection may be based upon one or more selection criteria related to size, position (e.g., near the center of a viewable area of the client display), orientation, user preferences, or other criteria.

Step 230 may further comprise creating virtual boards to represent the unused spaces. The virtual boards may define a position, size, proportion, width, and/or height of the unused space.

At step 250, secondary content is selected for display in one or more of the virtual boards. The secondary content may be selected and/or adapted to conform to the size and/or position of the virtual boards. In some embodiments, the secondary content comprises "Liquid Content" configured to adapt to dynamically sized display areas. The flow ends at step 260.

Figure 2B:
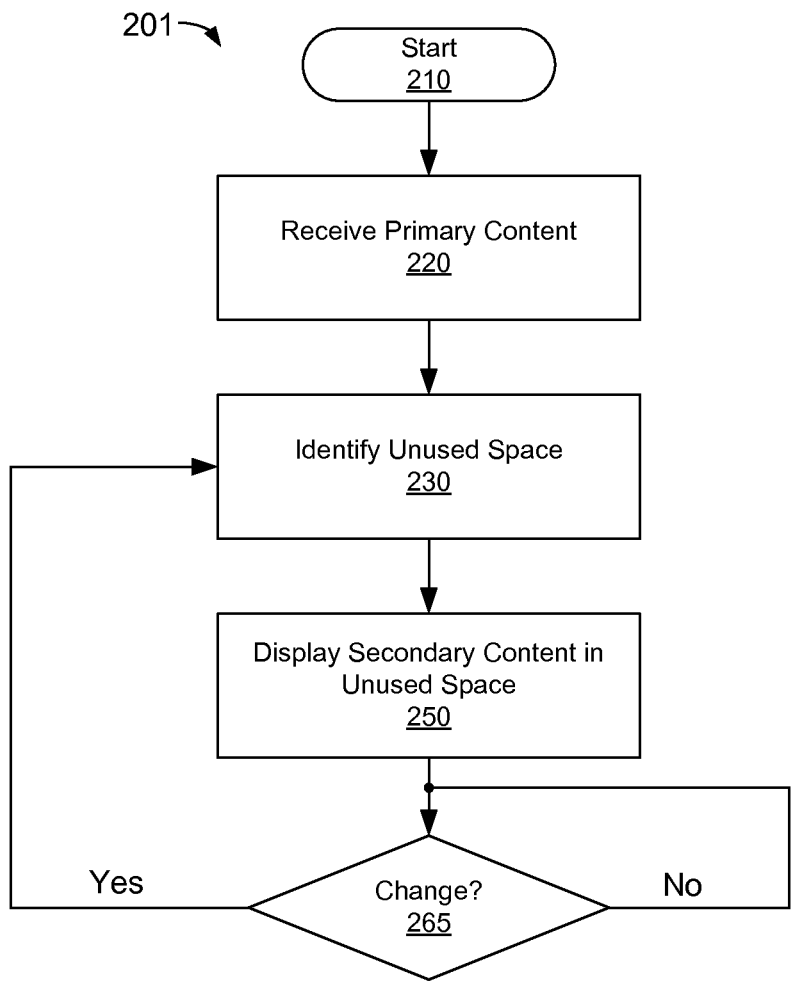
FIG. 2B is a flow diagram of another embodiment of a method for leveraging unused space on a client display.

FIG. 2B is a flow diagram of another embodiment of a method 201 for leveraging unused space to display secondary content on a client display. At steps 210, 220, 230, and 250 the method 201 starts and is initialized, receives primary content, identifies unused space (and creates corresponding virtual boards), and displays secondary content in the identified virtual boards, as described above.

At step 265, the method 201 identifies a change in the client display. The change may be any change affecting the viewable area of the client display, the client application (e.g., navigating to a different primary content page), or the like, including user interaction with primary or secondary content presented on the client display (e.g., selecting a link, positioning a cursor over an interaction area, etc.). Accordingly, the change identified at step 265 may include, but is not limited to, scrolling, changing a resolution of the client display, resizing the client application display area (e.g., window), moving the client application display area, changing the focus of user interface elements (taking elements into and/or out of focus), a change in the rendering of primary or secondary content, user interaction with user interface elements (e.g., selecting a link of the primary or secondary content), or the like.

If no change is detected, the flow continues to step 265; otherwise, the flow continues to step 230, where the unused space of the client display is identified in response to the change, and the flow continues as described above.

In some embodiments, unused space is identified using an application operating on a client device (manager tag application). The manager tag application may be implemented using any suitable scripting or execution environment including, but not limited to, JavaScript®, Adobe Flash®, ActionScript®, Java®, or the like. The manager tag application may be adapted according to preferences of the publisher of the primary content. The preferences may be used to determine the type of secondary content to display in the unused space, minimum resolution/aspect ratios of the secondary content, and so on.

In some embodiments, content distribution service provides the manager tag application to client devices. The content distribution server may customize the manager tag application according to the preferences of the publisher, which may comprise injecting one or more preferences into the manager tag application that is transferred to a client device. The manager tag application may be executable (or interpretable) on the client device to identify unused space on the client display, select and/or create virtual boards representing the unused space according to the preferences therein, and request secondary content for display in the virtual boards.

Figure 3:
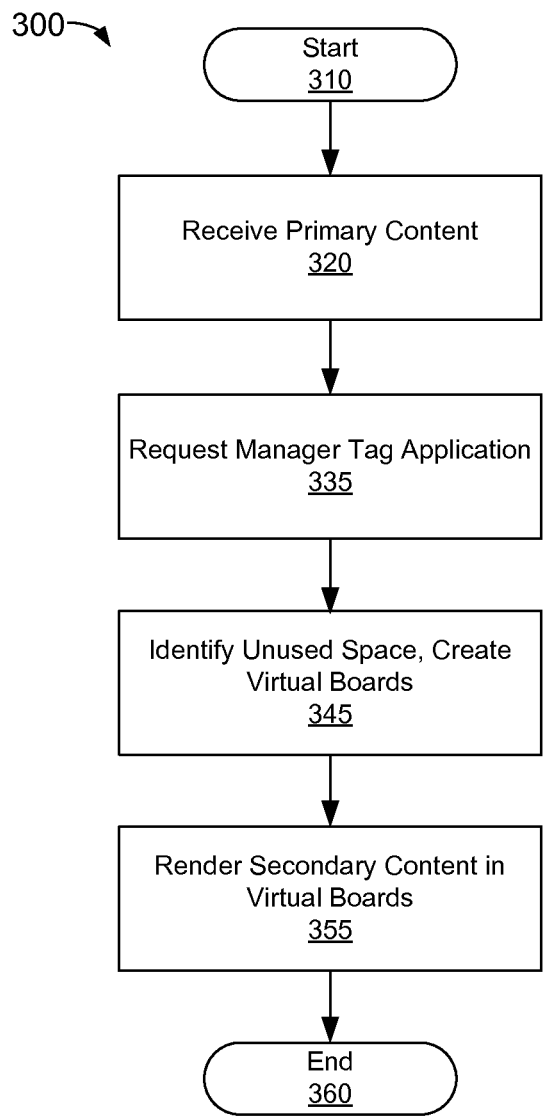
FIG. 3 is a flow diagram of another embodiment of a method for leveraging unused space on a client display.

FIG. 3 is a flow diagram of another embodiment of a method 300 for leveraging unused space to display secondary content. At steps 310 and 320, the method 300 starts and is initialized and receives primary content, as described above.

At step 335, a manager tag application is requested. In some embodiments, the request is transmitted in response to a "manager tag" included in the primary content. As discussed below, the manager tag may comprise JavaScript® (or other suitable code) configured to cause a client device to request the manager tag application from a content distribution service. The request of step 335 may identify the primary content and/or include an identifier of the publisher of the primary content of step 320 (e.g., an account identifier).

At step 345, a manager tag application is received. The manager tag application comprises executable (or interpretable) instructions configured to cause the client device to identify unused space on the client display and create virtual boards representing the unused spaces in accordance with preferences of the primary content publisher.

At step 355, the manager tag application provides for displaying secondary content on one or more of the virtual boards identified at step 345. Step 355 may comprise the client device requesting secondary content from the content distribution service (or other content provider), selected in accordance with the preferences of the publisher of the primary content. In some embodiments, the manager tag application is configured to display the secondary content. Alternatively, or in addition, secondary content may be displayed by another application (or in response to receiving the secondary content) provided by the content distribution service or another content provider.

The size and/or layout of the secondary content displayed at step 355 may be configured according to the virtual boards identified at step 345. In some embodiments, the secondary content comprises "Liquid Content" that is dynamically adaptable to differently sized and/or proportioned placeholders.

At step 355, the method receives the secondary content selected by the network-accessible service and displays the secondary content on the client display in the one or more virtual boards. The secondary content may be displayed with the primary content received at step 320.

At step 360, the method 300 ends until new primary content is received, at which point the flow continues to step 320. In some embodiments, step 360 comprises identifying a change in the client display, as described above. The change may be detected by the manager tag application requested at step 335. In response to a change, the manager tag application may identify unused space and display secondary content therein, as discussed above.

Figure 4:
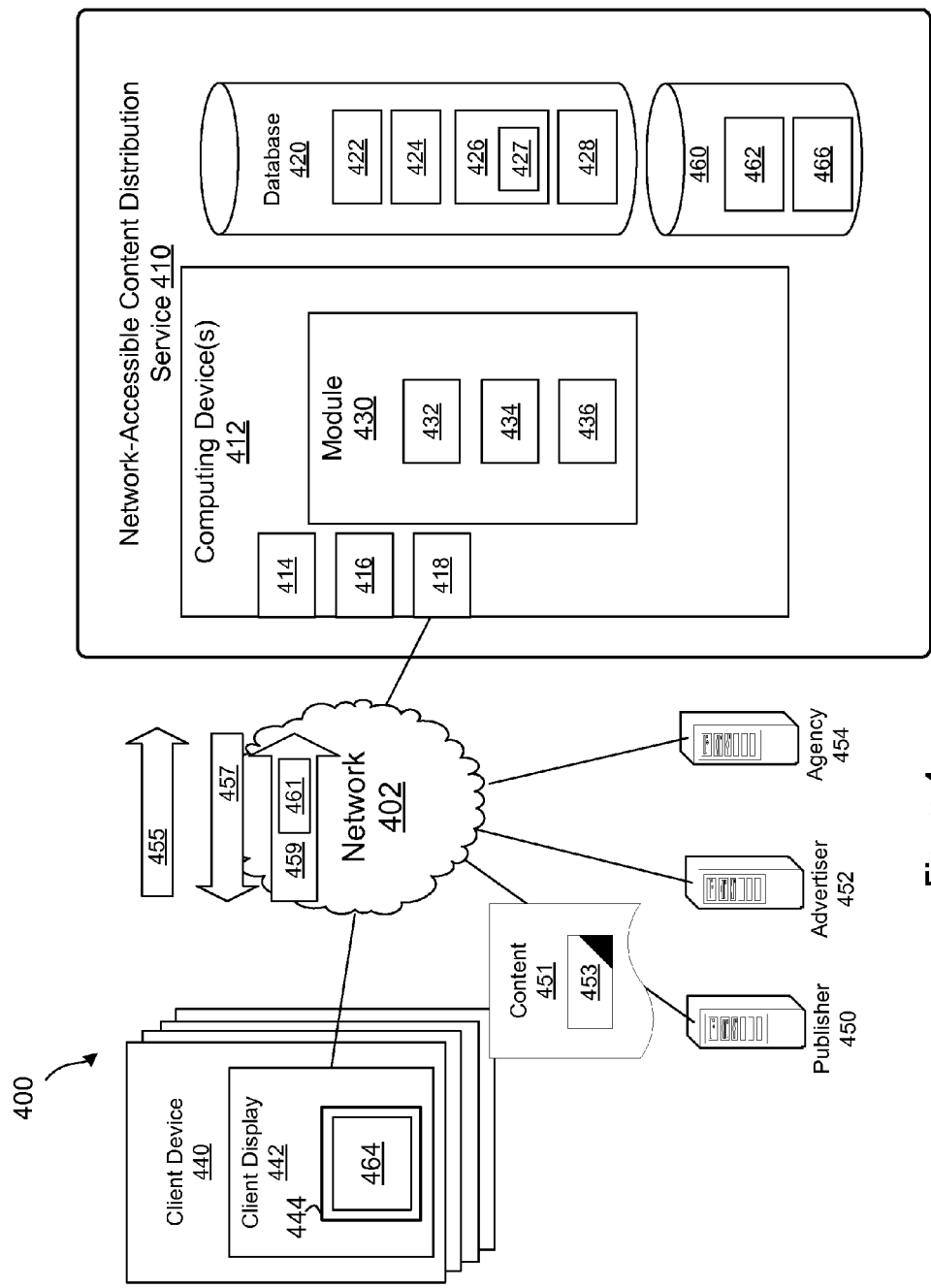
FIG. 4 is a block diagram of a system for leveraging unused space on a client display to display secondary content.

FIG. 4 is a block diagram of a system 400 for leveraging unused space to display secondary content. The system 400 includes a network-accessible content distribution system (CDS) 410 that comprises a computing device 412 (e.g., web server). The computing device 412 includes a processor 414, memory 416, and a communication interface 418 to communicatively couple the computing device to a network 402 (e.g., the Internet).

Organizations, such as content publishers 450, advertisers 452, and agencies 454, may register an account with the CDS 410. Publishers 450 may use the CDS 410 to include secondary content in primary content 451 provided to client devices 440 over the network 402. The primary content 451 may comprise web pages or other suitable types of content (e.g., video, audio, etc.). The publishers 450 may be compensated for displaying secondary content with the primary content 451 published thereby.

Advertisers 452 and/or agencies 454 may provide secondary content (advertising content) to be displayed within the unused space of client display 442 in conjunction with the primary content 451 of the registered publishers 450. The advertisers 452 and/or agencies 454 may compensate the publishers 450 (or CDS 410) for this service.

The CDS 410 maintains an account record 422 for each registered organization 450, 452, and/or 454 in a database 420 (or other suitable data storage mechanism). Each account record 422 is assigned a respective identifier. The database 420 may comprise a non-transitory computer-readable storage medium, such as a hard disk, an optical storage medium, non-volatile memory, or the like.

The CDS 410 provides one or more online interfaces for organizations to register, create, and/or manage account records 422, which may provide selection options for account type (e.g., publisher, advertiser, agency, and so on). The account type may activate different interface features; for example, the interfaces displayed to a publisher 450 may provide for management of a content distribution process, provide reports on content/ads distributed by different advertisers 452 or agencies 454, and the like. Advertiser and/or agency accounts may access interfaces providing management for features related to content/advertising management, reports on content/ads distributed with the primary content 451 provided to and/or viewed by users of the client devices 440, and so on.

An account record 422 may be associated with a "tag record" 426 comprising one or more registered content identifiers 427. As used herein, a content identifier identifies one or more primary content items (e.g., primary content 451) published by a publisher 450. A registered content identifier 427 may identify a particular webpage, a set of web pages (e.g., a directory), a domain, or the like. A registered content identifier 427 may comprise a URL and/or a qualified URL (e.g., a URL comprising a wildcard character, or other qualifier). Accordingly, in some embodiments, a single account record 422 may be used to manage more than one domain, publication, or other content.

The CDS 410 may further provide for creation of one or more user-level accounts for different individuals within the same organization 450, 452, and/or 454. Each user level account may be assigned a respective unique identifier, and may comprise a username and password (or other credentials). User account records 424 may be maintained in the database 420. User records 424 may be assigned different access levels or roles by a system administrator, which determines the operations (if any) the user is allowed to perform through the CDS 410. For example, "system administrator" user records 424 may represent users that are responsible for managing content and its distribution, and other roles may be assigned to user records 424 having other responsibilities (e.g., billing and/or reporting).

The account record of a publisher 450 may comprise and/or reference one or more tag records 426, which are configured to store content distribution parameters for one or more registered content identifiers (e.g., URLs) 427. The CDS 410 comprises a server-side application module 430 to manage tag records 426. The tag records 426 may be implemented using any suitable data storage mechanism, including, but not limited to, Transact SQL language and Microsoft SQL server, Oracle, MySQL, a directory, or the like.

Each tag record 426 may be associated with an account record 424 of a publisher 450 and may comprise one or more registered content identifiers 427. Publishers 450 may set parameters of the tag records 426 (and individual registered content identifiers 427) using a configuration interface provided by the CDS 410. Publishers 450 may register content identifiers (e.g., URLs) 427 under the tag record 426. As discussed above, each registered content identifier 427 may correspond to one or more content items published by the publisher 450 (e.g., webpage, set of web pages, domain, or the like). The publisher 450 may maintain parameters for each registered content identifier 427.

The parameters of a registered content identifier 427 may include demographic parameters describing the audience of a registered content identifier (e.g., the demographic parameters of the users to which a particular web page, or website, is directed). Examples of demographic parameters include, but are not limited to, gender, age, race, marital status, income level, geographic region, political affiliation, and so on.

The parameters of a registered content identifier 427 may further comprise content rendering parameters that specify how to leverage unused space on the client display 442. Content rendering parameters may specify content delivery conditions, such as page alignment and width, placeholder minimum square pixels, minimum width and height requirements, number of secondary content items to be delivered inside an unused space placeholder and their positioning, border margins and/or layout of the placeholders (e.g., virtual boards), and so on. The demographic and/or content rendering parameters may be set for each registered content identifier 427 in a tag record 426.

Other parameters may include conditional parameters for rendering secondary content when certain conditions are satisfied (e.g., minimum size, proportions, etc.). In some embodiments, a conditional parameter may pertain to user interaction with the primary content 451 and/or the secondary content of the placement 464. The interaction may include selecting a link, positioning a mouse cursor, or the like.

FIG. 5 depicts one example of an interface 500 configured to provide for managing demographic and/or content rendering parameters of a registered content identifier. The interface 500 may be published by the CDS 410 over the network 402. The interface 500 includes a display area 501 comprising a "tags" tab 502 for demographic and/or content rendering parameters for specified content. A link 503 provides access to the "website/section" portion of the interface 500. The interface 500 includes a website/section URL input 505, which identifies the content identifier to which the demographic parameters 510 and/or content rendering parameters 520 pertain. The identifier of input 505 may be the URL of a particular web page, a group of web pages (e.g., all content at a particular domain, or under a particular directory), a domain, a qualified domain, a sub-domain, or the like.

The demographic parameters input 510 receives parameters defining the demographics of the users to which the content is directed. The demographic parameters may be used to select suitable secondary content for display along with the primary content identified via the input 505. The content rendering parameters input 520 receives parameters defining how secondary content is to be displayed with the content identified in the input 505. Parameters input via the interface 500 may be stored in a tag record 426 in association with the registered content identifier of the input 505.

Referring back to FIG. 4, the CDS 410 may generate a "manager tag" for each publisher 450. The manager tag may be stored in an account record 422 and/or tag record 426 of the publisher 450. As used herein, a manager tag refers to a client-executable script that includes an account identifier of the publisher 450. A publisher 450 may maintain a single manager tag for each of a plurality of different domains and/or content pages (e.g., web pages); therefore, the manager tag may be used to reference a tag record 426, which, as discussed above, may comprise a plurality of different registered content identifiers 427, each having a respective set of demographic and/or content rendering parameters. Use of a single, common manager tag provides for a high level of automation.

Figure 6:
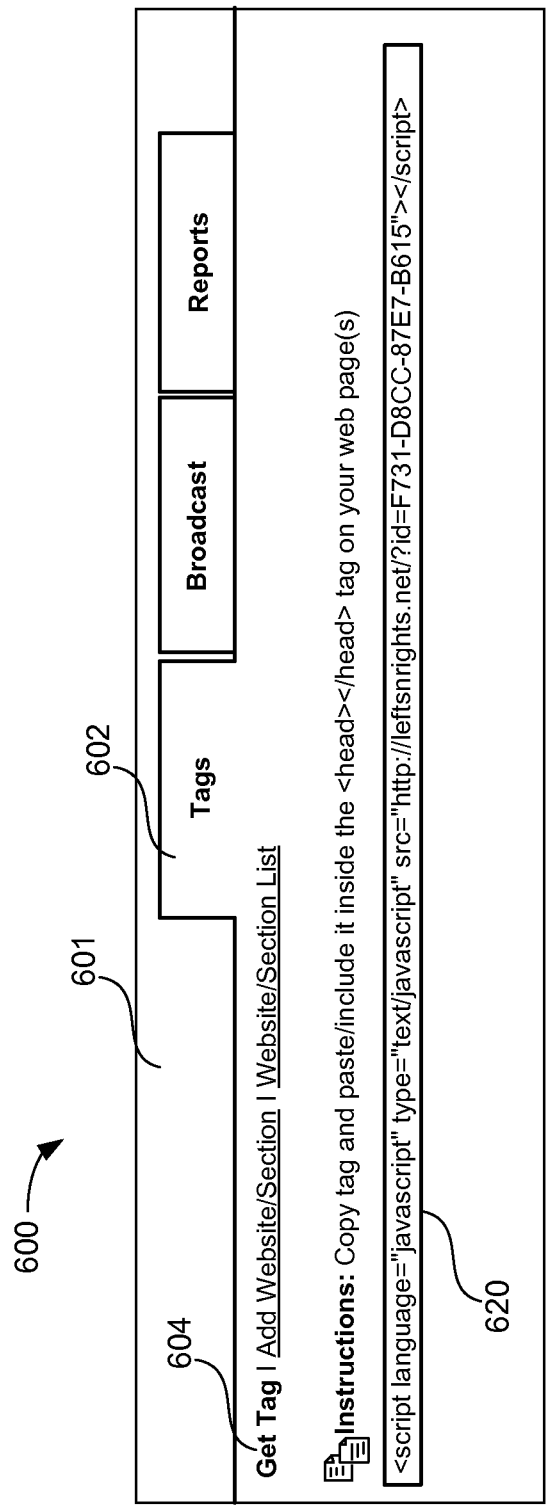
FIG. 6 depicts an exemplary interface for accessing a manager tag.

A publisher 450 may access the manager tag assigned thereto through a user interface provided by the CDS 410. FIG. 6 depicts one example of an interface 600 for accessing a manager tag. The interface 600 may be provided by the CDS 410 over the network 402. The interface 600 includes a display area 601 comprising a tab 602 for managing publisher manager tags 620. A link 604 provides access to the "manager tag" 620 of the publisher. The manager tag 620 may be copied using a conventional copy and paste operation. Alternatively, the interface 600 may include controls to provide access to the manager tag 620 in other ways (e.g., by e-mail, FTP, WebDAV, etc.). The manager tag 620 may include an account identifier that is encrypted or obfuscated to prevent misuse thereof. In the FIG. 6 example, "F731-D8CC-87E7-B615" represents an encrypted integer corresponding to a publisher account identifier.

The manager tag 620 may include a reference to machine-executable code configured to leverage unused space on a client display. In the FIG. 6 example, the manager tag references JavaScript® code accessible at a specified URL. The disclosure is not limited in this regard, however, and could be adapted to use any suitable scripting and/or plug-in mechanism.

Referring back to FIG. 4, the publisher 450 includes the manager tag 453 in primary content 451 published via the network 402. For example, the manager tag 453 may be included in a "head" portion of an HTML document:

```
<head>
<title>Document Title</title>
<script language="javascript" type="text/javascript"
    src="http://leftsnrights.net/?id=F731-D8CC-87E7-B615"></script>
</head>
```

The manager tag 453 may be processed as the client device 440 receives and/or renders the primary content 451. In some embodiments, the manager tag 453 is processed independently of the primary content 451 and, as such, may be included anywhere in the primary content 451. The publisher 450 may include the manager tag 453 using a server-side include, a server-side application, or the like.

In some embodiments, the publisher 450 configures the manager tag 453 to be dynamically processed before, during, or after the primary content 451 is rendered. The dynamic processing may occur in response to events on the client device 440, which may include, but are not limited to, changes to the position, size, and/or orientation of a client application (e.g., web browser application), programmatic events, user interaction with the primary content 451 or a placement 464 comprising secondary content (described below), and so on. Dynamic processing of the manager tag 453 may be implemented by triggering the manager tag 453 based upon content delivered by a third-party content provider, such as an advertising delivery system; content delivered inside a frame or an iframe, using Ajax, or the like; or content delivered within an applet such as Java® or Flash®. The following is an example of JavaScript® code configured to dynamically render the manager tag 453:

```
function render_manager_tag( ) {
    var LnR_script=document.createElement('script') ;
    var Lnr_script_src='http://leftsnrights.net/?id=F731-D8CC-87E7-
    B615';
    LnR_script.setAttribute("type","text/javascript") ;
    LnR_script.setAttribute("src", Lnr_script_src);
    var headTag = document.documentElementsByTagName("HEAD")[0];
```

```
    headTag.appendChild(LnR__script);
}
```

In some embodiments, processing the manager tag 453 comprises the client device 440 issuing a request 455 to the CDS 410 for a JavaScript® application in accordance with the "src" parameter of the manager tag 453. A tag management module 432 operating on the computing device 412 receives the request 455 and returns a manager tag application 457 in response. The manager tag application 457 identifies unused space on the client display 442, creates virtual boards 444 representing the unused space, and provides for rendering a placement 464 comprising secondary content in one or more of the virtual boards 444. The secondary content of the placement 464 may be provided by the CDS 410, an advertiser 452, an agency 454, or other source.

In some embodiments, the tag management module 432 uses an account identifier (or other identifier) of the request 455 to access an account record 422 and/or tag record 426 of the publisher 450. For example, the request 455 may comprise an account identifier of the publisher 450 (e.g., an encrypted or obfuscated account identifier integer, such as "F731-D8CC-87E7-B615"). The tag management module 432 uses a referral URL of the request 455 (or another, suitable identifier) to access a corresponding tag record 426 and/or registered content identifier 427. The tag management module 432 customizes the manager tag application 457 using the demographic and/or content rendering preferences of the registered content identifier 427. The customization may comprise injecting one or more of the parameters into the manager tag application 457.

In some embodiments, the tag management module 432 determines whether a referral URL of the request 455 (e.g., the referral URL of the primary content 451) has been registered by the publisher 450. If the referral URL of the request 455 is not registered (e.g., there is no registered content identifier 427 matching the referral URL), the tag management module 432 may ignore the request 455 and no manager tag application 457 is returned. This may prevent unauthorized persons from including a placement 464 in the content of the publisher 450. The tag management module 432 may perform a hierarchical search within the registered content identifiers 427. If no exact match is found, the tag management module 432 may reference a separate "offline" datastructure 428 comprising "unverified" content identifiers (URLs). If the referral URL is marked as "bad" in the datastructure 428 (by the publisher 450 or user 424 thereof), the tag management module 432 ignores the request 455 and no manager tag application 457 is returned. If the referral URL is included in a list of URLs that are marked as "approved" by the publisher 450 (or authorized user 424 thereof), a manager tag application 457 is returned. The demographic and/or content rendering parameters of the manager tag application 457 may be selected from the "closest" matching registered content identifier 427. If the referral URL does not exist in the datastructure 428, the URL may be included in a list of "unverified" URLs, which may be approved by the publisher 450 (or user 424 thereof). Accordingly, the tag management module 432 prevents distribution of the manager tag application 457 to primary content 451 not associated with a registered and/or approved content identifier, while allowing for efficient updates to the list of approved referral URLs by the publisher 450. Moreover, since the publisher 450 manages the URLs using a single manager tag, with customization and/or configuration managed by the CDS 410, the publisher 450 does not have to constantly update its primary content 451 and/or the manager tag 453 included in the primary content 451 (e.g., each web page of the publisher 450 may include the same manager tag 453, while having separate demographic and/or content rendering parameters).

As described above, the tag management module 432 may customize the manager tag application 457 according to the preferences of a registered content identifier 427. The customization may comprise injecting one or more parameters into the manager tag application 457 (e.g., at pre-determined locations within an application template). The parameters may include demographic parameters, content rendering parameters, conditional parameters, or the like. The exemplary manager tag application 457 may include comments and placeholders injected by a tag management module 432 (or other suitable server-side process).

The client device 440 processes the manager tag application 457, which identifies unused space on the client display 442, creates virtual boards 444 representing the unused space, and provides for displaying secondary content (e.g., placements 464) on one or more of the virtual boards 444.

Figure 7:
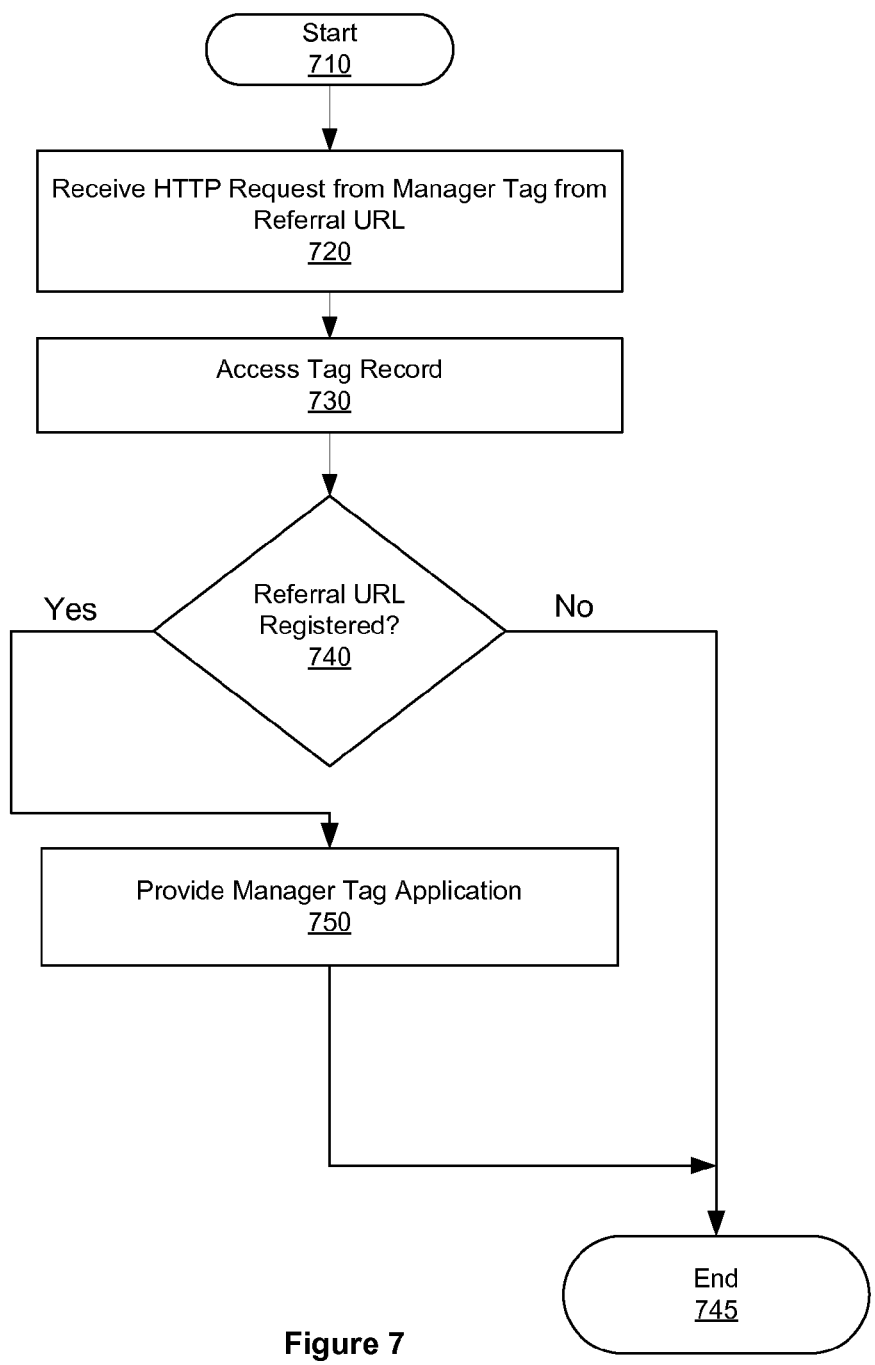
FIG. 7 is a flow diagram of another embodiment of a method for displaying secondary content in unused space on a client display.

FIG. 7 is a flow diagram of one embodiment of a method 700 for leveraging unused space on a client display. At step 710, the method 700 starts and is initialized as described above.

At step 720, a request for a manager application and/or secondary content is received. The request may be received in response to a client device processing a manager tag, as described above. The request may include an account identifier and/or a referral URL (or other content identifiers).

At step 730, a tag record of the publisher of the primary content is accessed. The publisher may be identified using an account identifier (or other identifier) included with the request of step 720 (e.g., an encrypted or obfuscated account identifier). The tag record may be accessed in a database, directory, or other persistent storage mechanism using the referral URL.

At step 740, the method 700 determines a referral URL of the request, and determines whether the referral URL has been registered in the tag record of step 730. As discussed above, a tag record of a publisher may comprise one or more registered content identifiers (website/section URLs), each of which is associated with respective parameters, such as demographic parameters, content rendering parameters, and so on. The referral URL may be the referral URL of the primary content page from which the request of step 720 originated.

If the referral URL is not registered, the request may be ignored and the flow ends at step 745; otherwise, the flow continues to step 750. Alternatively, in some embodiments, if the referral URL is not registered (has no exact match in the registered content identifiers), the method 700 queries an offline datastructure comprising "unverified" referral URLs. The publisher may "verify" the referral URL by including it in the offline set. If the referral URL is found in the offline set of "unverified" URLs, the referral URL is marked as "verified," and the flow continues to step 750. If the URL is not in the offline datastructure and/or the URL has been marked as "bad," the flow continues to step 745. The referral URL verification of step 750 may prevent distribution of secondary content to URLs that have not been registered and/or unauthorized registration of URLs, while using a single manager tag to distribute content to a plurality of different, referral URLs, each having different respective parameters (as opposed to inserting different manager tags into each different referral URL). Moreover, the use of a single manager tag allows server-side updates to occur without modification to the primary content.

At step 750, the method 700 provides a manager tag application to the client device in response to the request of step 720. Step 750 may comprise customizing the manager tag application using the tag record (and information pertaining to the registered URL). As discussed above, a registered URL may be associated with parameters, including, but not limited to, demographical parameters, content rendering parameters, conditional parameters, and the like. One or more of these parameters may be injected into the manager tag application at step 750. The manager tag application may be configured to cause a client device to identify unused space on a client display, create one or more virtual boards 444 representing the unused space, and display secondary content on the one or more virtual boards 444, as described above.

Referring back to FIG. 4, the CDS 410, or other distribution service, may comprise a placement database 460 comprising one or more placement records 462. As used herein, a placement record refers to a data record for presenting secondary content. A placement record 462 may comprise one or more conditions, such as size, scale, and/or proportion constraints. These conditions may determine whether a particular placement may be presented on a particular virtual board 444 (e.g., whether the virtual board 444 has an acceptable size, scale, etc.). A placement record 462 may also identify and/or reference one or more secondary content items for display on the placement. The secondary content items may include, but are not limited to, images, text, video, audio, interactive content (e.g., Flash®, Java®, ActionScript®, etc.), dynamic content (e.g., HTML5), or the like.

The placement record 462 may include formatting directives (e.g., HTML) to render the secondary content items of the placement. In some embodiments, a placement record comprises independent HTML code (e.g., in a <div> layer) that may be embedded and rendered within a virtual board 444. A placement record 462 may be associated with metadata (parameters), such as targeted demographics (e.g., age, gender, keywords, etc.), rendering conditions, target URLs, and so on.

A placement record 462 may include information and/or instructions for rendering secondary content in a virtual board 444. For example, the placement record may comprise HTML code to embed streaming video content, an image file, or the like. The instructions and/or rendering code may include HTML that may be dynamically rendered by JavaScript® and include additional JavaScript® or similar language code to provide interactive capabilities and features. For example, the placement may be rendered for a pre-defined period of time and then trigger delivery of another piece of secondary content (or content sequences) in the same or different virtual board 444.

Publishers 452 and/or agencies 454 may manage placement records 462 using one or more interfaces provided by the CDS 410. FIG. 8 depicts an exemplary interface 800 for managing a placement record. The interface 800 includes a display area 801 and a "broadcast" tab 802 for managing placement records and/or associated secondary content. The link 803 accesses interface elements for creating a placement.

A name or identifier of the placement is entered via an input 805. The placement in the FIG. 8 example is identified as "Content #1." An input area 810 is configured to receive target demographics of the placement. In some embodiments, the target demographics of a placement record are compared to demographics of a registered content identifier (e.g., registered URL) to select placements for display. The target demographics may include, but are not limited to, gender, age, race, marital status, income, geographical location, interest areas, political affiliation (e.g., conservative, liberal, etc.), and so on. In some embodiments, a set of target demographics may be imported from a "channel," which is a common set of target demographics shared by one or more placements.

The interface 800 may further include a timeframe input 820 to specify a starting and/or ending time for the placement. The placement may not be selected for display before the starting time and/or after an ending time of the timeframe input 820.

The interface 800 further includes an input 830 for rendering of the placement. The rendering conditions may include, but are not limited to, size of the virtual board (in overall area), minimum width, maximum width, minimum height, maximum height, proportions, and so on. A user may specify a reach and/or frequency of the placement. As used herein, the reach is the number or percentage of different users (e.g., client devices 440) exposed at least once to the placement over the timeframe 820. Reach may refer to the number of unique exposures of the placement, excluding duplication. As used herein, the frequency of a placement refers to the number of times that the average client device is exposed to the placement in the timeframe 820.

In some embodiments, a placement is associated with additional types of parameters (e.g., conditional parameters), defining one or more conditions to be satisfied to render the placement. Rendering conditions 830 pertain to the size and/or proportions of a virtual board. Other conditional parameters may pertain to user interaction with primary content or other placements (e.g., secondary content). For example, as shown in FIG. 1N, a virtual board 177 may be created and/or rendered, in response to user interaction at the client display. These types of conditional parameters may be included via the interface 800 and/or may be defined in content rendering code.

In some embodiments, a placement may be "assigned" to one or more referral URLs via an input 840. The placement may be displayed in conjunction with primary content to which it is assigned. Alternatively, or in addition, the placement may be automatically selected according to the target demographics, timeframe, and/or rendering conditions.

Figure 9:
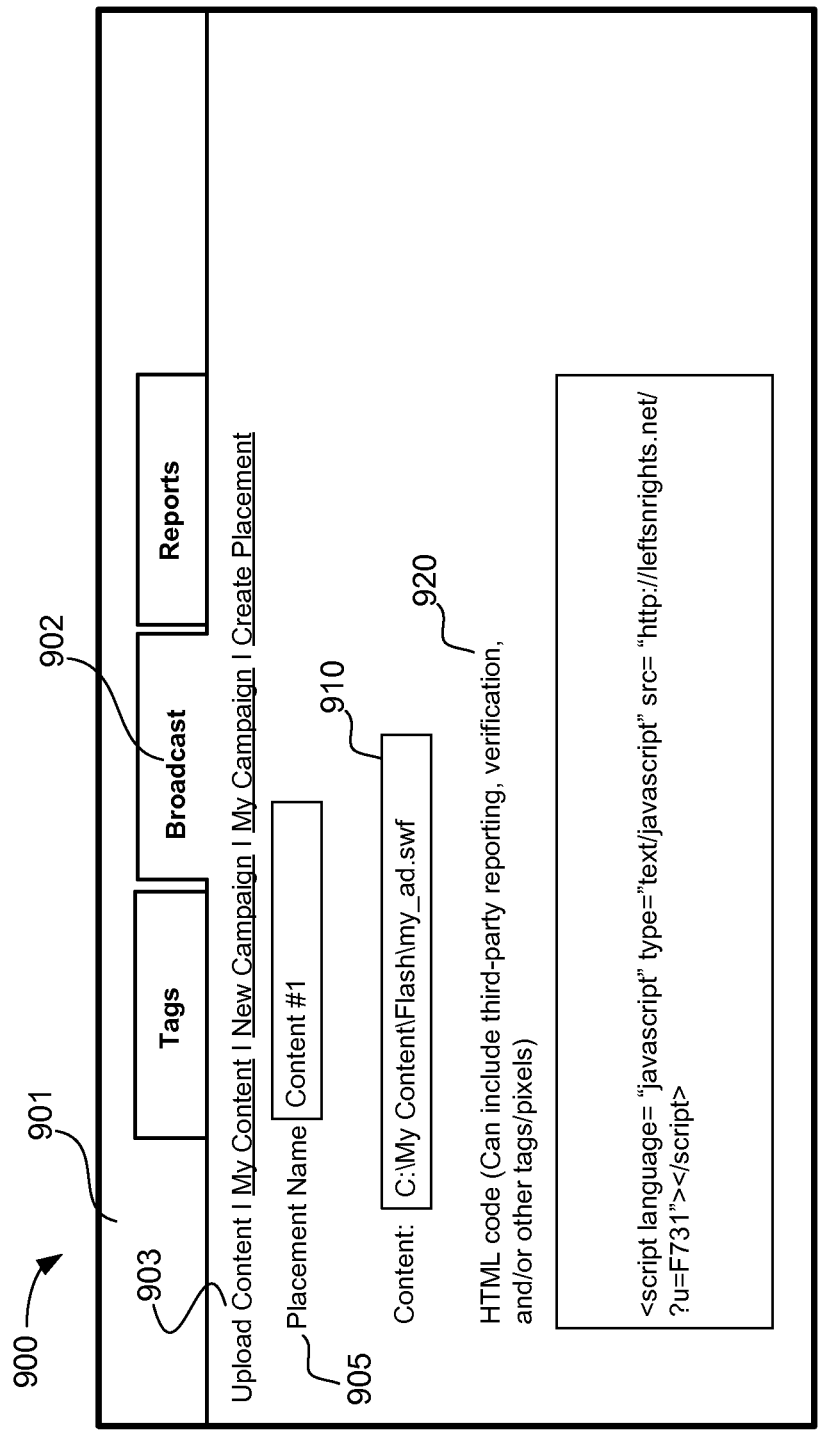
FIG. 9 depicts an exemplary interface for managing secondary content.

A placement may be displayed (e.g., rendered) in a virtual board 444. As such, a placement may be associated with one or more content items and/or rendering instructions, such as HTML. FIG. 9 depicts an exemplary interface 900 for managing secondary content of a placement. The interface 900 is displayed on a broadcast tab 902 of a display area 901 in response to selecting an "upload content" link 903. The input 905 is used to specify the name of the placement to which the uploaded content pertains (e.g., "Content #1" per the FIG. 8 example). In some embodiments, the input 905 includes a browser and/or includes a search interface to find placements of the user. The input 910 allows secondary content items to be uploaded and associated with the specified placement. Alternatively, or in addition, the secondary content may be specified in HTML code and/or may reference secondary content items hosted on another, third-party content distribution service (e.g., website). When the "Content #1" placement is selected, the uploaded content of input 910 and/or the HTML of the input 920 is rendered on a virtual board 444 on a client display.

Referring back to FIG. 4, as discussed above, the manager tag application 457 is configured to identify unused space on the client display 442 and to create corresponding virtual boards 444. Upon creating a virtual board 444, the manager tag application 457 transmits a request 459 for a placement to display therein. In some embodiments, the request 459 specifies the height, width, and/or position of the virtual board 444. The request 459 may further include one or more of the parameters of the registered content identifier 427 (e.g., demographic parameters, content rendering parameters, and/or conditional parameters).

In some embodiments, creating the virtual board 444 comprises injecting a "content tag" (e.g., HTML <script> tag) inside of the virtual board 444 (e.g., into the code defining the virtual board 444). The content tag may include one or more parameters pertaining to the client device 440, such as a browser identifier (or other application identifier), time zone, version, network address, and so on. The content tag may further include a placement identifier 461 of the client device 440 (discussed below). The parameters of the content tag may be used to select a placement (or other secondary content) for display in the virtual board 444. The following is an exemplary JavaScript® to dynamically inject a content tag into a virtual board:

```
var LnR_script=document.createElement('script');
LnR_script.setAttribute("type","text/javascript");
LnR_script.setAttribute("src","http://leftsnrights.net/content/?"+
    top.LnR_q+"&ps="+top.LnR_v[i].ps+"&i="+i+
    "&w="+w+"&h="+h+&ex="+rendered_content_list+"
    &placement_id="+Placement_ID+list_of_parameters);
document.getElementById("LnR_VirtualBoard"+i).-
    appendChild(LnR_script);
```

A placement module 434 operating on the computing device 412 receives the request 459 and selects secondary content (a placement) for display on the virtual board 444. The selection may comprise the placement module 434 selecting a placement record 462 from the placement database 460. The selection may be based on comparing parameters of the request 459 (e.g., virtual board configuration, demographic parameters, content rendering parameters, conditional parameters, etc.) to parameters of placement records 462 in the placement database 460. Alternatively, or in addition, the selection may be based upon referral URL assignments of the placement records 462 (e.g., determining whether the referral URL of the primary content 451 is assigned to a particular placement record 462). In some embodiments, placements are selected using a placement queue, which, as discussed below, determines the ordering and/or frequency of certain placements.

The placement module 434 selects a placement in response to the request 459, and the placement content is rendered in the specified virtual board 444 on the client display 442. The secondary content of the placement 464 may be accessed from the CDS 410 (e.g., secondary content uploaded to the CDS 410) add/or from one or more third-party sources, such as the publisher 450, advertiser 452, agency 454, or other suitable source.

In some embodiments, CDS 410 includes a reporting module 436 that tracks placements provided to the client devices 440. Since the manager tag application 457 verifies that the placement 464 is rendered and visible on the client display 442, the reporting module 436 may report a "view time" of each placement.

In some embodiments, placement records 462 are selected according to a "placement queue." As used herein, a placement queue refers to a sequence of placements for display on a client device 440. A placement queue may be used to control the order, reach, and/or frequency of the placements in the queue. A placement queue may be associated with a tag record 426 (and/or registered content identifiers 427) in the database 420.

Figure 10:
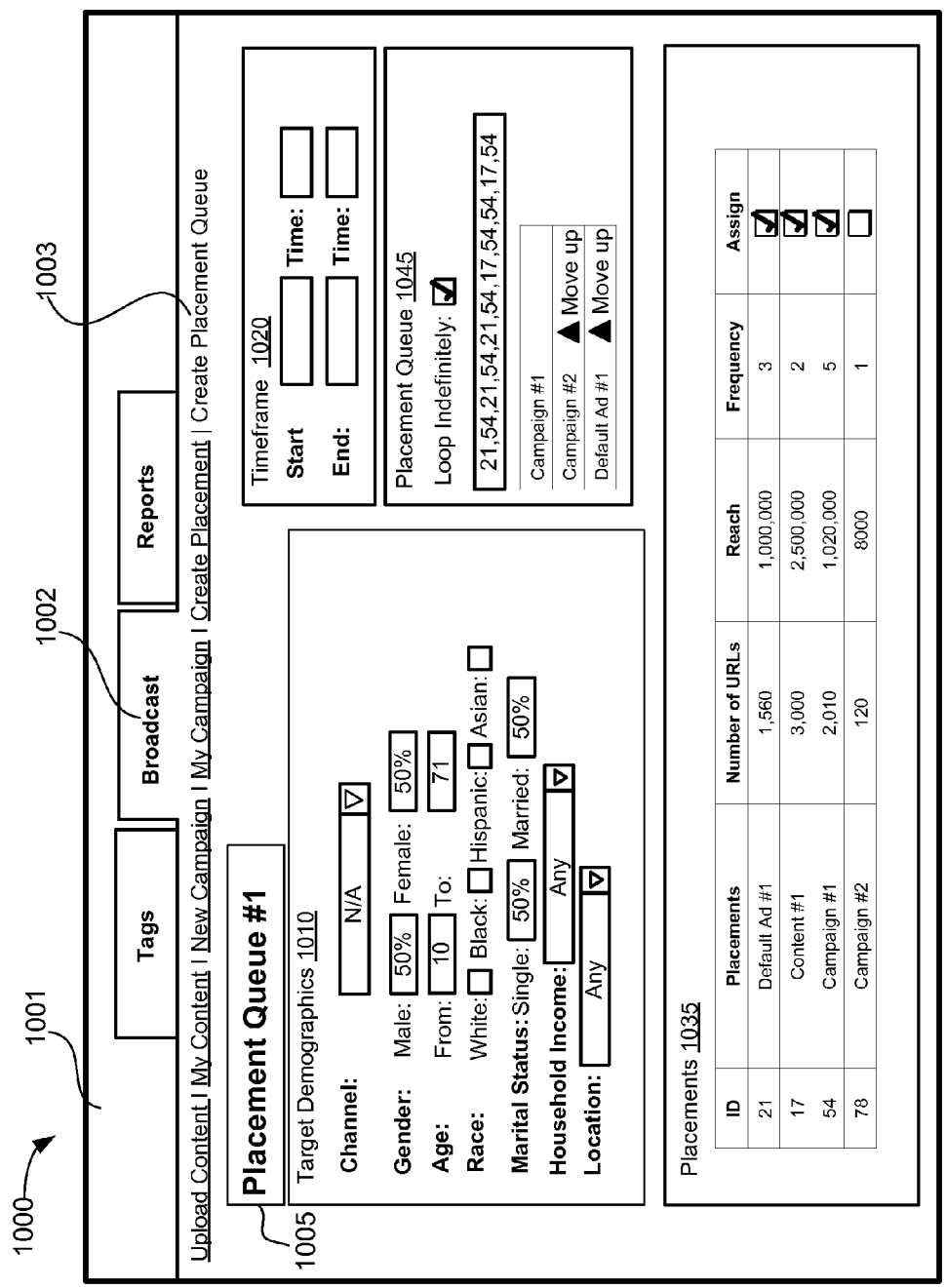
FIG. 10 depicts an exemplary interface for managing a placement queue.

FIG. 10 depicts one example of an interface 1000 for managing a placement queue. The interface 1000 may be provided by the CDS 410 or other content distribution system. The interface 1000 includes a display area 1001 having a broadcast tab 1002 and link 1003 to create a placement queue. An input 1005 receives a name or other identifier of the placement queue (e.g., "Placement Queue #1"). A placement queue may include target demographics 1010, which may be based upon (or override) target demographics of the placements in the queue (e.g., placement demographics input via input 810 of FIG. 8). The interface 1020 may also include a timeframe input 1020 to specify a relevant timeframe (start and/or end time) of the placement queue.

Available placements are displayed in a list 1035 of the interface 1000. The list 1035 may include placements that are available for inclusion in the queue (e.g., placements of the user who is creating the placement queue). A user may specify which placements are to be included in the queue (as well as their order) in a placement queue input 1045. The placement queue input 1045 includes an ordered placement listing and an option to "loop" the placements (e.g., loop the placement queue).

Referring back to FIG. 4, like a placement record 462, a placement queue 466 may be associated with a tag record 426 and/or registered content identifier 427. Accordingly, a user may specify which referral URLs are to show the placements of a placement queue 466.

In some embodiments, the manager tag application 457 maintains placement state information 461 on the client device 440. The placement state information 461 may include a viewer identifier (e.g., an identifier of the client device 440 and/or user of the client device 440) and/or a placement identifier. In some embodiments, the placement identifier may identify the placement 464 that is to be displayed within the virtual board 444. Alternatively, or in addition, the placement identifier may comprise a listing of the placements 464 that have been displayed on the client device 440 (if any) and/or may identify a particular placement queue.

The placement state information 461 may be stored on the client device 440 (or on another, third-party storage and/or tracking service) using any suitable mechanism, including, but not limited to, browser cookies, cross-domain cookies, tracking cookies, a Local Shared Object (LSO) (e.g., implemented using ActionScript® or another suitable execution environment), an Applet property or parameter, or the like. The manager tag application 457 may create and/or store placement state information (e.g., generate a new viewer identifier) if no placement state information 461 is available on the client device 440.

The placement state information 461 may be used to select placements 464 and/or to track which placements have been viewed.

For example, a placement queue 466 may create a placement queue 466 comprising three placements (e.g., placements 1, 2, and 3). The placement queue may further specify that the sequence of placements is to be repeated three times for each viewer. The resulting placement queue 466 may comprise the sequence "1,2,3,1,2,3,1,2,3," causing the placements to rotate one by one with the total frequency of three. A different sequence (e.g., "1,1,2,2,3,3") will cause each placement to be rendered twice for each viewer every time each viewer visits one of the registered content identifiers with the total frequency of two. A representation of the placement queue 466 (e.g., a placement sequence as described above) may be transmitted to the client device and stored in the placement state information 461. Placement requests 457 include a placement identifier (in placement state information 461) selected from the sequence. After rendering a placement 464, the manager tag application 457 updates the placement state information to select a "next" placement (e.g., the placement is "removed" from the list). For example, after displaying placement "1" for the first time, the manager tag application 457 updates the placement sequence to "2,3,1,2,3,1,2,3." Accordingly, the placement state information 461 for the next placement request 459 will include the placement identifier "2."

In some embodiments, the manager tag application 457 maintains state information indicating which placements have been viewed on the client device 440 (e.g., and/or specifying the time the placements were viewed). The reporting information may be transmitted to and/or maintained by a reporting module 436 operating on the CDS 410 (or another, third-party service, such as an advertiser 452 or agency 454).

If the placement state information 461 does not specify a "next" placement identifier, the placement module 434 selects a placement 464 or placement queue 466 from the placement database 460 as described above (e.g., based upon demographic parameters, content rendering parameters, conditions, and so on). In some embodiments, the placement module 434 assigns a placement queue to the client device 440. The placement queue may include a sequence of placement identifiers to be displayed on the client device 440 (e.g., an ordered sequence of placement identifiers). The placement module 434 may return the placement queue along with the placement 464. The manager tag application 457 may store the placement queue in placement state information 461 of the client device 440 and may select subsequent placement identifiers therefrom.

Figure 11:
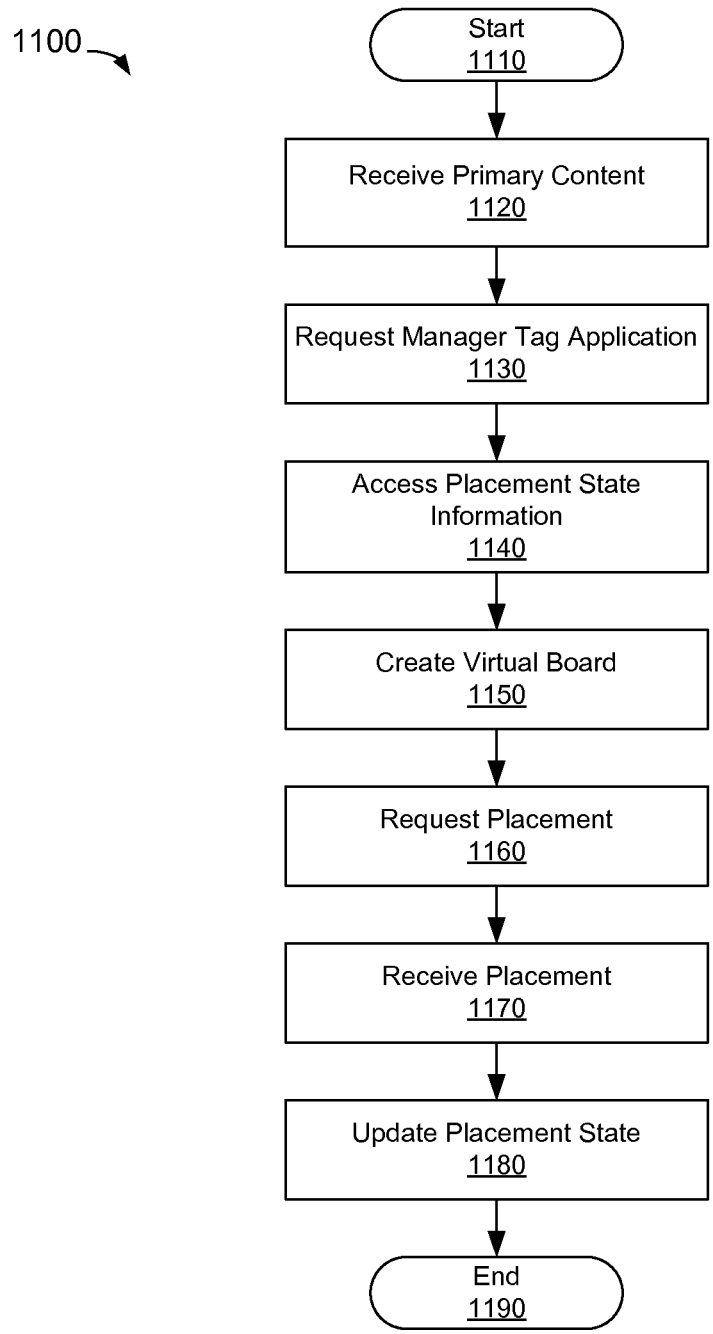
FIG. 11 is a flow diagram of another embodiment of a method for leveraging unused space on a client display.

FIG. 11 is a flow diagram of one embodiment of a method 1100 for leveraging unused space on a client display. At steps 1110-1120, the method 1100 starts and is initialized, and primary content comprising a manager tag is received. At step 1130, and in response to processing the manager tag, the method 1100 requests a manager tag application, which identifies unused space on the client display.

At step 1140, the method accesses placement state information pertaining to the client device or user thereof. The placement state information may be stored on the client device (e.g., in a cookie, LSO, etc.) and/or may be maintained by a third-party service. The placement state information may include a viewer identifier and/or a placement identifier. If no placement state information is available, step 1140 may comprise creating and storing a new set of placement state information (e.g., a new viewer identifier).

At step 1150, the method 1100 creates a virtual board representing unused space on the client display (e.g., as identified at step 1130). Creating the virtual board may comprise including HTML, or other markup, into the primary content page (e.g., as a <div> tag, frame, or the like). Step 1150 may further comprise injecting a content tag into the virtual board, which, as described above, may include parameters pertaining to the client device and/or the placement state information of step 1140.

At step 1160, the method 1100 generates a request for a placement to display on the virtual board of step 1150. The request may include the placement state information injected into the virtual board at step 1150, such as the viewer identifier and/or placement identifier (if any).

At step 1170, a placement for display within the virtual board is received. The placement may be rendered within the virtual board as described above (e.g., HTML code of the placement may be included within the virtual board of step 1150). Step 1170 may further comprise receiving a placement queue specifying the "next" placements to display on the client device.

Step 1180 comprises updating the placement stage information of the client device. Step 1180 may comprise storing a new placement queue received with the placement at step 1170. Alternatively, the update may comprise indicating that the placement of step 1170 has been displayed and selecting a "next" placement in the placement queue. The updated placement state information may be stored on the client device or on a third-party service.

At step 1190, the flow ends until a new virtual board is created and/or new primary content is received.

Figure 12:
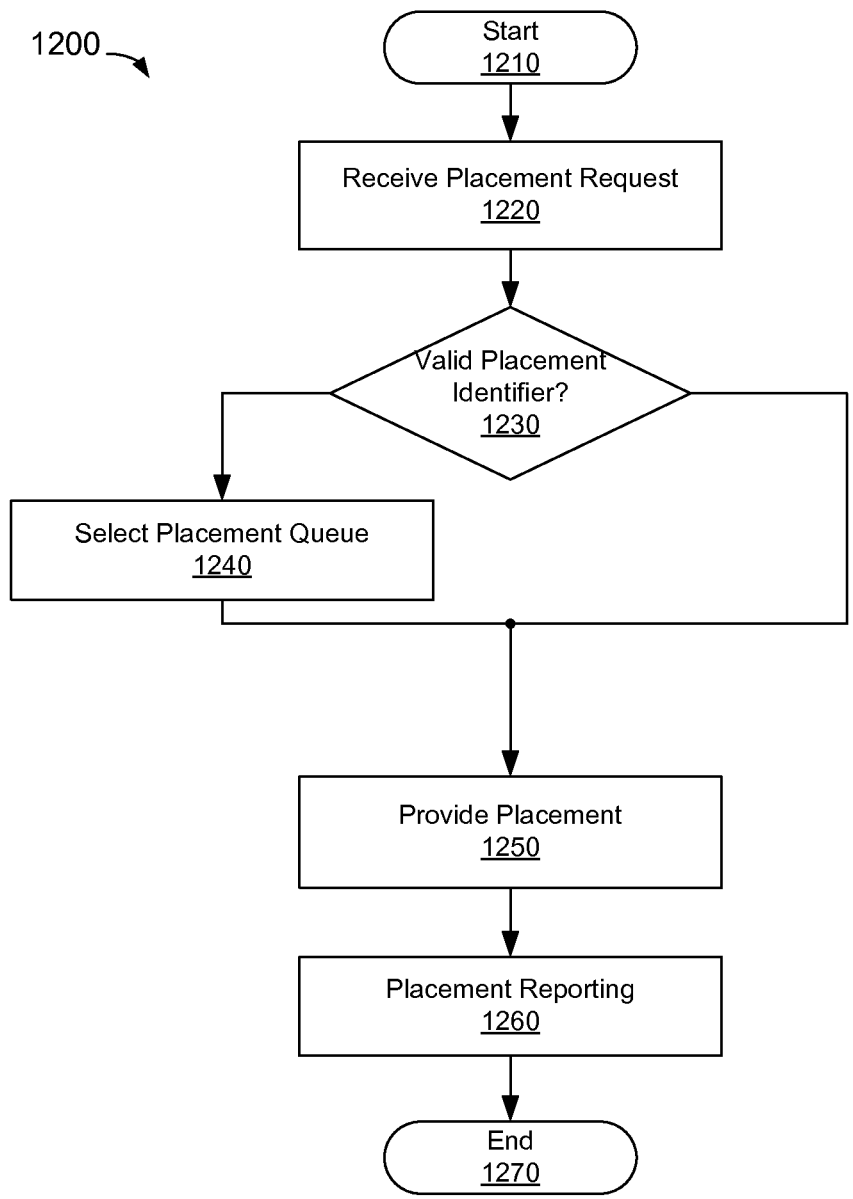
FIG. 12 is a flow diagram of a method for selecting a placement.

FIG. 12 is a flow diagram of one embodiment of a method 1200 for leveraging unused space on a client display. At step 1210, the method 1200 starts and is initialized as described above. At step 1220, a request for a placement is received.

Step 1230 comprises determining whether the request includes a valid placement identifier. Step 1230 may comprise accessing a placement identifier (or placement queue) in the request and determining whether the requested placement is still "valid" (e.g., based upon one or more time-frame, reach, and/or frequency comparisons). If the placement identifier is valid, the flow continues to step 1250; otherwise, the flow continues to step 1240.

Step 1240 comprises selecting a new placement or placement queue as described above. Step 1250 comprises providing a placement in response to the request. Step 1250 may comprise returning HTML code and one or more secondary content items (e.g., Adobe Flash®, etc.) to the requester.

Step 1260 comprises reporting the placement, which may include storing an indicator that the placement and/or placement queue was displayed on the client device. The reporting may comprise receiving validation (or other indicator) that the placement was rendered on the client device.

At step 1270, the flow ends until a next placement request is received.

Referring back to FIG. 4, the CDS 410 may comprise a reporting module 436 that is configured to maintain statistics pertaining to placement and/or placement queue viewing. The reporting module 436 may report a "Gross Rating Points" (GRP) for each placement record 462 (or placement queue 466). Since each client device 440 may potentially receive a different placement 464 and the manager tag application 457 may verify that the placement is viewable on the client display 442, the reporting module 436 may be capable of generating highly accurate reporting information.

Accordingly, the reporting module 436 may maintain statistics that are similar to a television broadcasting model (as opposed to a typical Internet model in which placement viewability is not verifiable). In some embodiments, the reporting module 436 updates reporting information as placements are provided to client devices 440. Alternatively, or in addition, the reporting module 436 may receive periodic updates from client devices 440 and/or receive verification from the placement 464 (or a third-party service) that the placement 464 was rendered on the client display 442.

As discussed above, the unused space (and corresponding virtual boards) may be variable in size, proportions, and/or position. These parameters may only be known at rendering time. In some embodiments, placements 464 may be configured to "adapt" to differently sized virtual boards. The adaptations may comprise a client-side application for assembling secondary content based upon available space. Content configured to adapt to varying sizes and/or proportions is referred to herein as "Liquid Content."

Liquid content may be included as secondary content and/or as placement instructions (e.g., HTML, JavaScript®, etc.) of a placement record 462. In some embodiments, Liquid Content is implementing using Adobe Flash® ActionScript®, although other suitable mechanisms could be used, including, but not limited to, Java®, JavaScript®, Jscript®, ECMAScript, HTML5, or other scripting capable of positioning and rendering content elements in a pre-determined way based on size, scale, or proportions of the virtual board.

The Liquid Content allows for any advanced creative and interactivity. The Liquid Content unit can include and assemble different types of content elements, such as images, rich media, animation, video streaming, expendable ads, database driven content and shopping carts with secured transactions, games, and social networking interactivity. The Liquid Content unit can also include any other fixed-size and fluid content where the size or proportions of the screen and available empty space can trigger additional events. For example, if the virtual board is smaller than a pre-determined size, smaller image files may be selected for rendering, whereas if the virtual board is larger, another, larger image file may be used. This adaptation allows for quality control of the rendered content, preventing resized images to become pixilated or blurred.

Figure 13A:
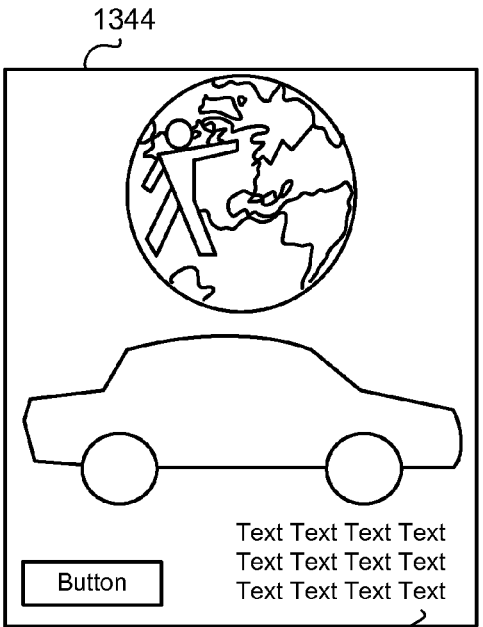
FIGS. 13A-C depict exemplary adaptations of secondary content to different virtual board configurations.
Figure 13B:
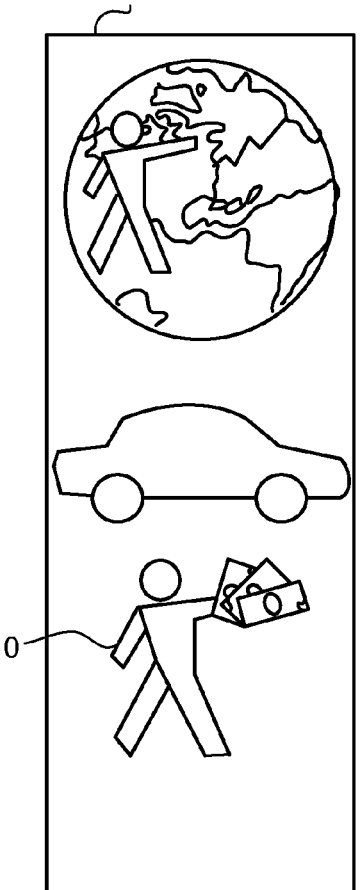
Figure 13C:
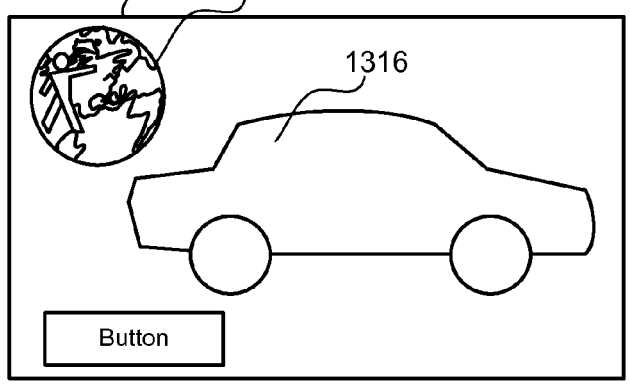

FIGS. 13A-C depict exemplary Liquid Content rendering adjustments 1300 to layout, size, scale, and proportions of graphic, images, video, and text elements in accordance with the available space within a virtual board 1344. The adaptations may be configured to fill up the entire available space (or a pre-determined portion thereof) based on specified instructions in such a way that the content elements will be automatically rendered with maximum scale possible without losing visual quality of the content or according to other instructions.

In some embodiments, a Liquid Content application prevents stretching graphic elements (as shown in FIG. 13B) and/or unintentional overlapping of one element by another when elements are resized and change position (as shown in FIG. 13C). Each time a user moves or resizes the browser window, the manager tag application (e.g., application 457) may recalculate the position and size of the virtual boards and adjust their size to fit therein (e.g., virtual boards 444 on client display 442). The changes may trigger the Liquid Content to re-render to match the dimensions of the virtual board 1344 and/or re-arrange graphics and other visual elements of the content, according to instructions.

User interactions with a client display may modify the virtual board 1344 of FIG. 13A into the configurations shown in FIGS. 13B and 13C (and vice versa). As shown in FIG. 13B, an additional graphic 1310 (and/or other content elements) may be included (or removed) in response to changes in the size and/or proportions of the virtual board 1344. In the FIG. 13C example, the text 1312 of FIG. 13A is removed due to lack of available space on the virtual board 1344.

Accordingly, the Liquid Content may comprise references to one or more secondary content items, each of which may be interchanged in response to different configurations of the virtual board 1344. Moreover, in some embodiments, the Liquid Content may comprise multiple copies of the secondary content at different resolutions and/or sizes. The different copies may be selected according to a particular layout and/or configuration of the Liquid Content. For example, in FIG. 13C, a reduced-resolution image 1314 is used to prevent overlap with the image 1316.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of medium/computer-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the invention.

We claim:

1. A method, comprising:
providing computer-readable code configured for execution by a processor of a client computing device, the computer-readable code configured to cause the client computing device to,
identify unused space, the identified unused space to exist within a display of the client computing device when an application presents primary content within the display
modify markup data corresponding to the primary content at the client computing device, wherein the markup data is modified to create an element configured to represent the identified unused space in the modified markup data, and
insert secondary markup data into the element created within the modified markup document such that the application processes the modified markup data, including the secondary markup data, to present the primary content and secondary content within the display.

2. The method of claim 1, wherein the secondary content comprises content of a third-party advertiser.

3. The method of claim 1, wherein the secondary content comprises fixed-size content.

4. The method of claim 1, wherein markup data comprises Hyper Text Markup Language (HTML) data, and wherein the secondary markup data comprises HTML data.

5. The method of claim 1, wherein the secondary content comprises one or more fixed-size images.

6. The method of claim 1, wherein the provided computer-readable code is configured to cause the client computing device to modify one or more of the element created within the modified markup data and the secondary markup data inserted into the element in response to detecting a change pertaining to the display.

7. The method of claim 6, wherein the change comprises one or more of scrolling within a browser window and resizing the browser window.

8. A non-transitory computer-readable storage medium comprising instructions configured to cause a computing device to perform operations, comprising:
identifying unused space to exist within a client display when an application operating on the computing device presents primary content on the client display, the primary content corresponding to a markup document;
modifying the markup document to include an element representing the identified unused space; and
inserting secondary markup data within the element created within the modified markup document representing the identified unused space, wherein the secondary markup data is configured to be processed by the application such that the application presents the secondary content with the primary content on the client display.

9. The non-transitory computer-readable storage medium of claim 8, wherein the markup document comprises a Hyper Text Markup Language (HTML) document, and wherein the secondary markup data comprise HTML data.

10. The non-transitory computer-readable storage medium of claim 8, wherein the secondary markup data inserted within the element created within the modified markup document comprises one or more of Hyper-Text Markup Language (HTML) data, eXtensible Markup Language (XML) data, and a link.

11. The non-transitory computer-readable storage medium of claim 8, wherein inserting the secondary markup data comprises inserting a reference to a server of a third party.

12. The non-transitory computer-readable storage medium of claim 8, wherein the client display comprises an application window, the operations further comprising modifying the element created within the modified markup document in response to detecting one or more of scrolling within the application window, positioning of the application window, selection of a tab of the application window, reorientation of the application window, and resizing the application window.

13. The non-transitory computer-readable storage medium of claim 8, the operations further comprising selecting secondary markup data to insert within the element based on a size of the identified unused space.

14. The non-transitory computer-readable storage medium of claim 8, wherein the application is configured to generate the markup document corresponding to the primary content in response to processing at least a portion of electronic markup data of the primary content, and wherein processing the portion of the electronic markup data comprises the application executing a script to identify the unused space to and to modify the markup document to include the element representing the unused space.

15. A system for content distribution, comprising:
a content distribution server comprising a processor, memory, and a network interface to communicatively couple the content distribution server to an electronic communication network,
wherein the content distribution server is configured to provide computer-readable code to an-application operating on a client computing device through the electronic communication network responsive to the application processing markup data for presentation of primary content on a display of the client computing device, wherein the computer-readable code is configured to cause the client computing device to,
identify empty space corresponding to presentation of the primary content on the display of the client computing device,
modify the primary markup data to create a placeholder element to represent the identified empty space, and
generate a request for advertising content to be inserted into placeholder element of the modified markup data, and wherein
the content distribution server is further configured to select advertising content in response to the request from the client computing device, wherein the application processes the modified markup data, including the selected advertising content inserted into the placeholder element thereof, for presentation of the primary content and the selected advertising content on the display of the client computing device.

16. The system of claim 15, wherein the content distribution server is configured to select advertising content of a third-party advertisement content distributor.

17. The system of claim 15, wherein the selected advertising content includes one or more images.

18. The system of claim 15, wherein the computer-readable code provided by the content distribution server is configured to cause the computing device to modify a layout of the placeholder element included in the modified markup data in response to detecting one or more of a resize operation and a scroll operation.

19. The system of claim 15, wherein the computer-readable code provided by the content distribution server is configured to cause the client computing device to modify a position of the placeholder element within the modified markup data in response to detecting one or more of a resize operation and a scroll operation.

20. The system of claim 15, wherein the computer-readable code provided by the content distribution server is configured to cause the client computing device to generate a request for updated advertising content in response to detecting a resize operation.

* * * * *

(12) INTER PARTES REVIEW CERTIFICATE (3216th)
United States Patent
Mentchoukov et al.

(10) Number: US 9,575,934 K1
(45) Certificate Issued: Aug. 11, 2023

(54) SYSTEMS AND METHODS FOR ADAPTIVE CONTENT DISTRIBUTION

(71) Applicants: Nikolai Mentchoukov; James Warren Rowan

(72) Inventors: Nikolai Mentchoukov; James Warren Rowan

(73) Assignee: LEFTSNRIGHTS, INC.

Trial Number:

IPR2018-01480 filed Aug. 3, 2018

Inter Partes Review Certificate for:

Patent No.: 9,575,934
Issued: Feb. 21, 2017
Appl. No.: 14/521,252
Filed: Oct. 22, 2014

The results of IPR2018-01480 are reflected in this inter partes review certificate under 35 U.S.C. 318(b).

INTER PARTES REVIEW CERTIFICATE
U.S. Patent 9,575,934 K1
Trial No. IPR2018-01480
Certificate Issued Aug. 11, 2023

AS A RESULT OF THE INTER PARTES REVIEW PROCEEDING, IT HAS BEEN DETERMINED THAT:

Claims 1-19 are cancelled.

\* \* \* \* \*